US012191111B2

(12) United States Patent
Ishizaka et al.

(10) Patent No.: US 12,191,111 B2
(45) Date of Patent: Jan. 7, 2025

(54) CHARGED PARTICLE BEAM SYSTEM AND METHOD FOR DETERMINING OBSERVATION CONDITIONS IN CHARGED PARTICLE BEAM DEVICE

(71) Applicant: Hitachi High-Tech Corporation, Tokyo (JP)

(72) Inventors: Fumiya Ishizaka, Tokyo (JP); Daisuke Bizen, Tokyo (JP); Makoto Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 449 days.

(21) Appl. No.: 17/594,656

(22) PCT Filed: May 8, 2019

(86) PCT No.: PCT/JP2019/018454
§ 371 (c)(1),
(2) Date: Oct. 25, 2021

(87) PCT Pub. No.: WO2020/225891
PCT Pub. Date: Nov. 12, 2020

(65) Prior Publication Data
US 2022/0246394 A1 Aug. 4, 2022

(51) Int. Cl.
*H01J 37/28* (2006.01)
(52) U.S. Cl.
CPC ....... *H01J 37/28* (2013.01); *H01J 2237/2803* (2013.01)
(58) Field of Classification Search
CPC ............... H01J 37/28; H01J 2237/2803; H01J 2237/2817; H01J 37/026; H01J 37/222; H01J 37/244; H01J 37/147
(Continued)

(56) References Cited

U.S. PATENT DOCUMENTS 7,132,301 B1   11/2006   Fan
2004/0211899 A1   10/2004   Ezumi et al.
(Continued)

FOREIGN PATENT DOCUMENTS

JP   2005-191017 A   7/2005
JP   2007-258017 A   10/2007
(Continued)

OTHER PUBLICATIONS

International Search Report (PCT/ISA/210) issued in PCT Application No. PCT/JP2019/018454 dated Aug. 6, 2019 with English translation (five (5) pages).
(Continued)

*Primary Examiner* — Michael Maskell
(74) *Attorney, Agent, or Firm* — Crowell & Moring LLP

(57) ABSTRACT

The present disclosure provides a technique enabling accurate ascertaining of a charged state of a resist pattern resulting from irradiation of a charged particle beam. The present disclosure provides a charged particle beam system provided with: a charged particle device provided with a charged particle source, deflectors for causing a primary charged particle beam emitted from the charged particle source to be scanned over a sample, an energy discriminator for performing energy discrimination for secondary electrons emitted when the primary charged particle beam has reached the sample, and a detector for detecting secondary electrons which have passed the energy discriminator; and a computer system for generating a scan image on the basis of signal amounts detected by the detector, which fluctuate during scanning of primary charged particles by the deflectors, and storing the scan image into an image storage unit. The computer system generates a scan image for each frame at the time of frame integration of the scan image, calculates an amount of static build-up in each frame on the basis of the
(Continued)

output of the scan image of each frame, and outputs information on the amount of static build-up.

16 Claims, 13 Drawing Sheets

(58) Field of Classification Search
 USPC .................................. 250/306, 307, 310, 311
 See application file for complete search history.

(56) References Cited

U.S. PATENT DOCUMENTS

| | | | |
|---|---|---|---|
| 2007/0221844 | A1 | 9/2007 | Yamanashi et al. |
| 2008/0277583 | A1 | 11/2008 | Yano et al. |
| 2008/0315093 | A1 | 12/2008 | Hasegawa et al. |
| 2012/0153145 | A1 | 6/2012 | Cheng et al. |
| 2014/0027635 | A1 | 1/2014 | Matsui et al. |
| 2016/0240348 | A1* | 8/2016 | Yokosuka ............... H01J 37/22 |
| 2017/0062180 | A1* | 3/2017 | Budach ................... H01J 37/36 |
| 2018/0286629 | A1* | 10/2018 | Sakakibara ............. H01J 37/22 |

FOREIGN PATENT DOCUMENTS

| | | |
|---|---|---|
| JP | 2008-282630 A | 11/2008 |
| JP | 2009-4114 A | 1/2009 |
| JP | 2012-15113 A | 1/2012 |
| JP | 2012-155980 A | 8/2012 |
| JP | 2015-43334 A | 3/2015 |
| JP | 2017-134882 A | 8/2017 |
| JP | 6294213 B2 * | 3/2018 ............ H01J 37/147 |
| WO | WO 2016/084675 A1 | 6/2016 |

OTHER PUBLICATIONS

Japanese-language Written Opinion (PCT/ISA/237) issued in PCT Application No. PCT/JP2019/018454 dated Aug. 6, 2019 (four (4) pages).

* cited by examiner

[FIG. 1]
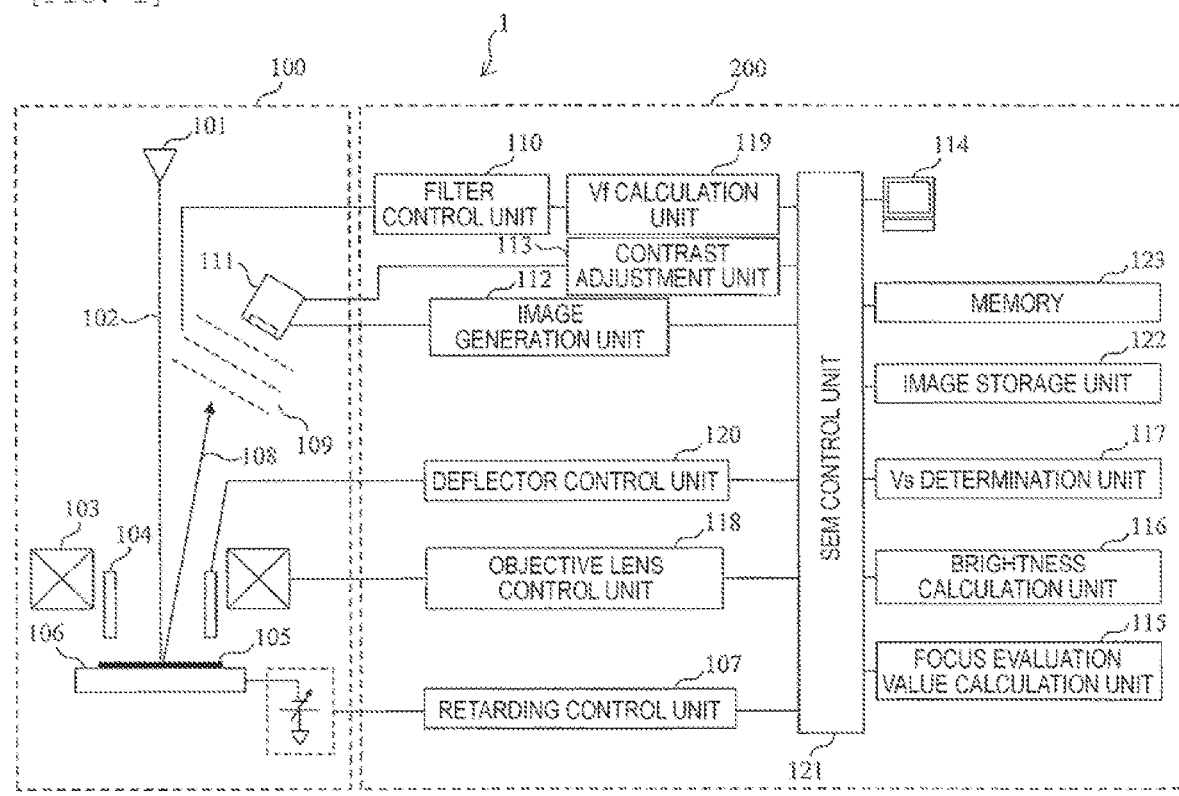

[FIG. 2]
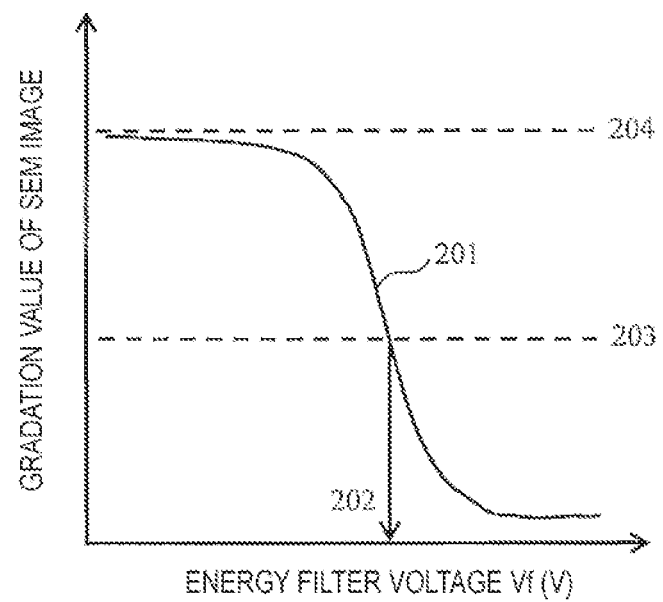
[FIG. 3]
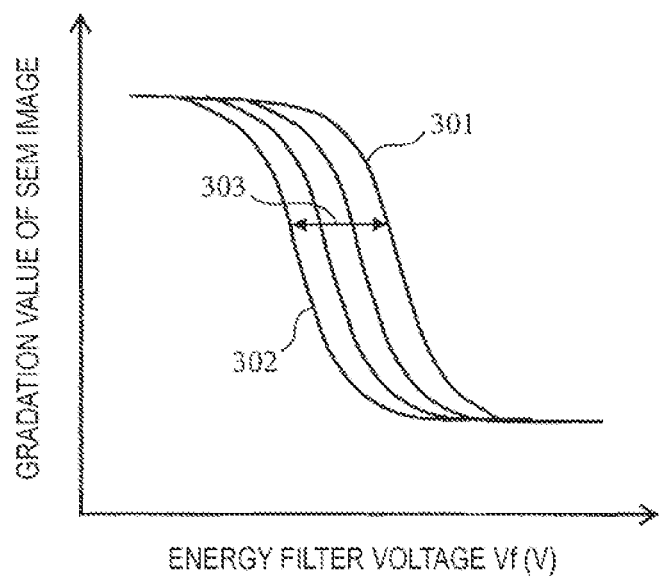

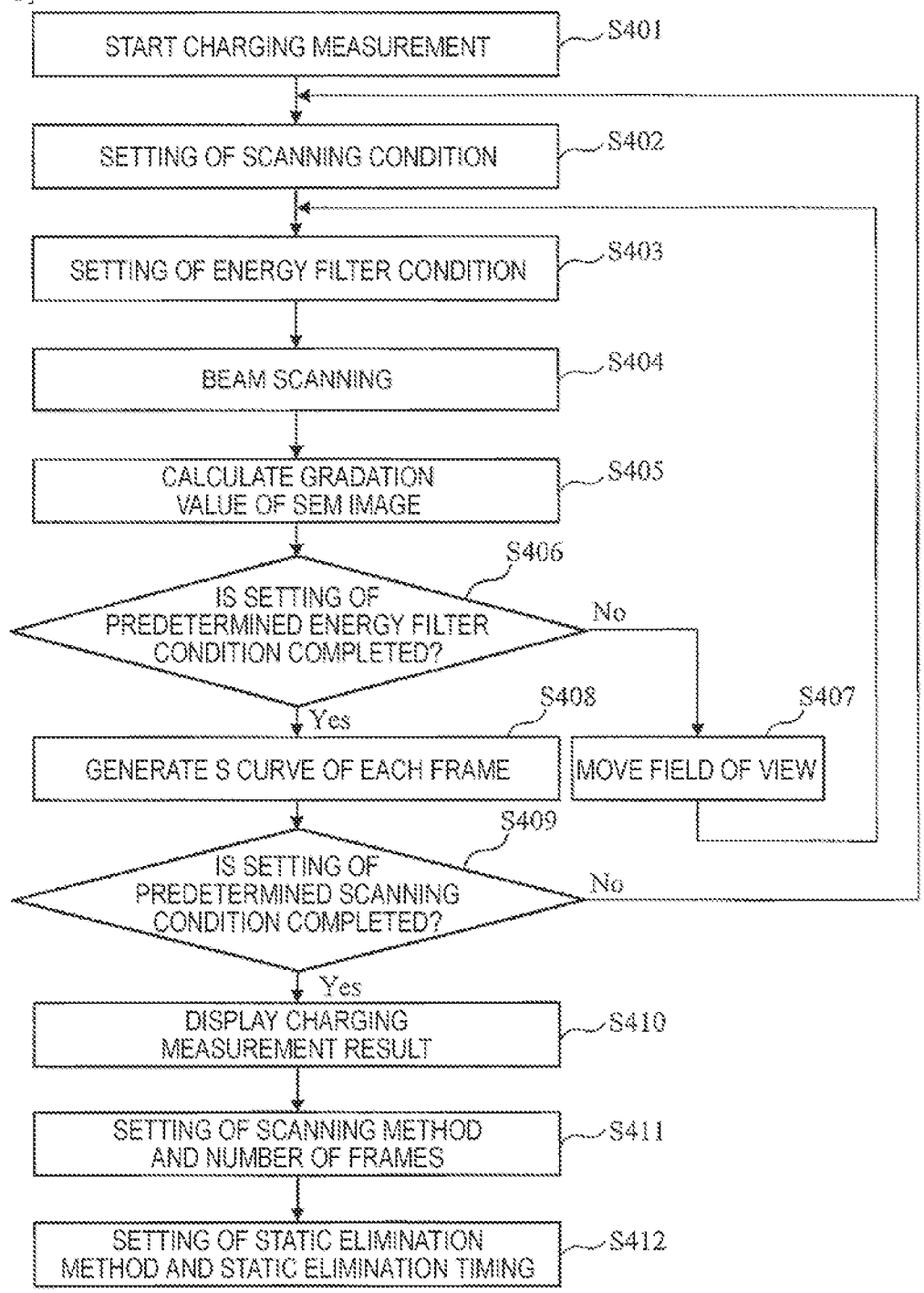

[FIG. 5]
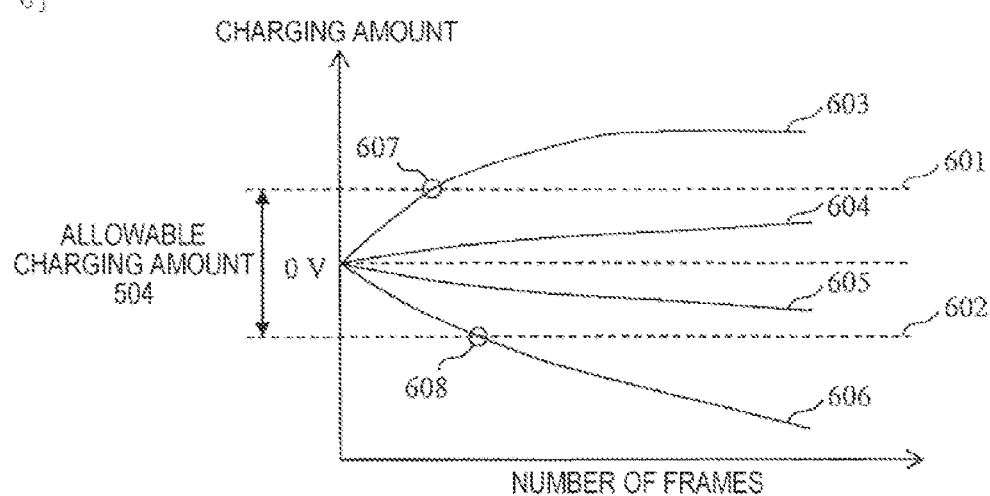
[FIG. 6]

[FIG. 7]
| | OPTIMUM CONDITION | | |
|---|---|---|---|
| | ☐ CONDITION A | ■ CONDITION B | ☐ CONDITION C |
| 701 — SCANNING TYPE | TV | TV2 | Slow |
| 702 — NUMBER OF FRAMES | 32 | 128 | 16 |
| 703 — CHARGING CODE | positive | positive | negative |
| 704 — STATIC ELIMINATION METHOD | LCN ▼ | — ▼ | LIGHT IRRADIATION ▼ — 706 |
| 705 — STATIC ELIMINATION TIMING | FOR EVERY 16 FRAMES | — | FOR EVERY 4 FRAMES |
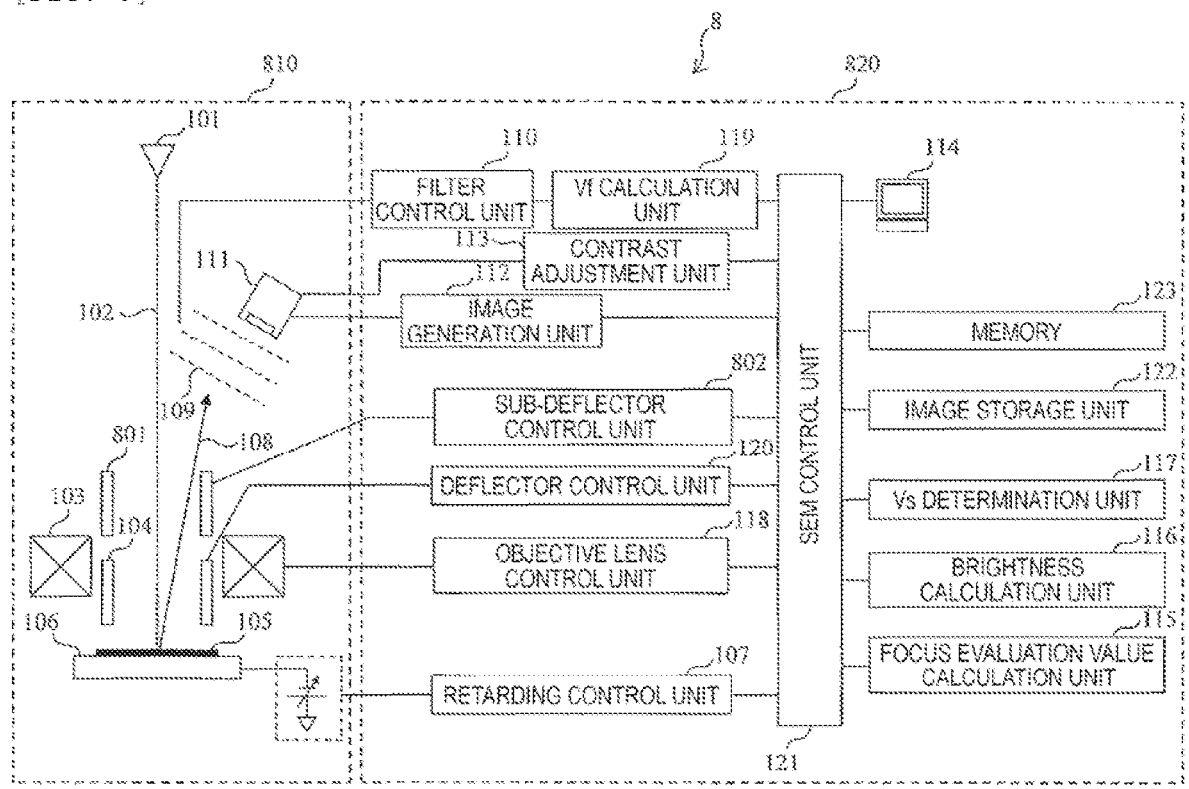
[FIG. 8]

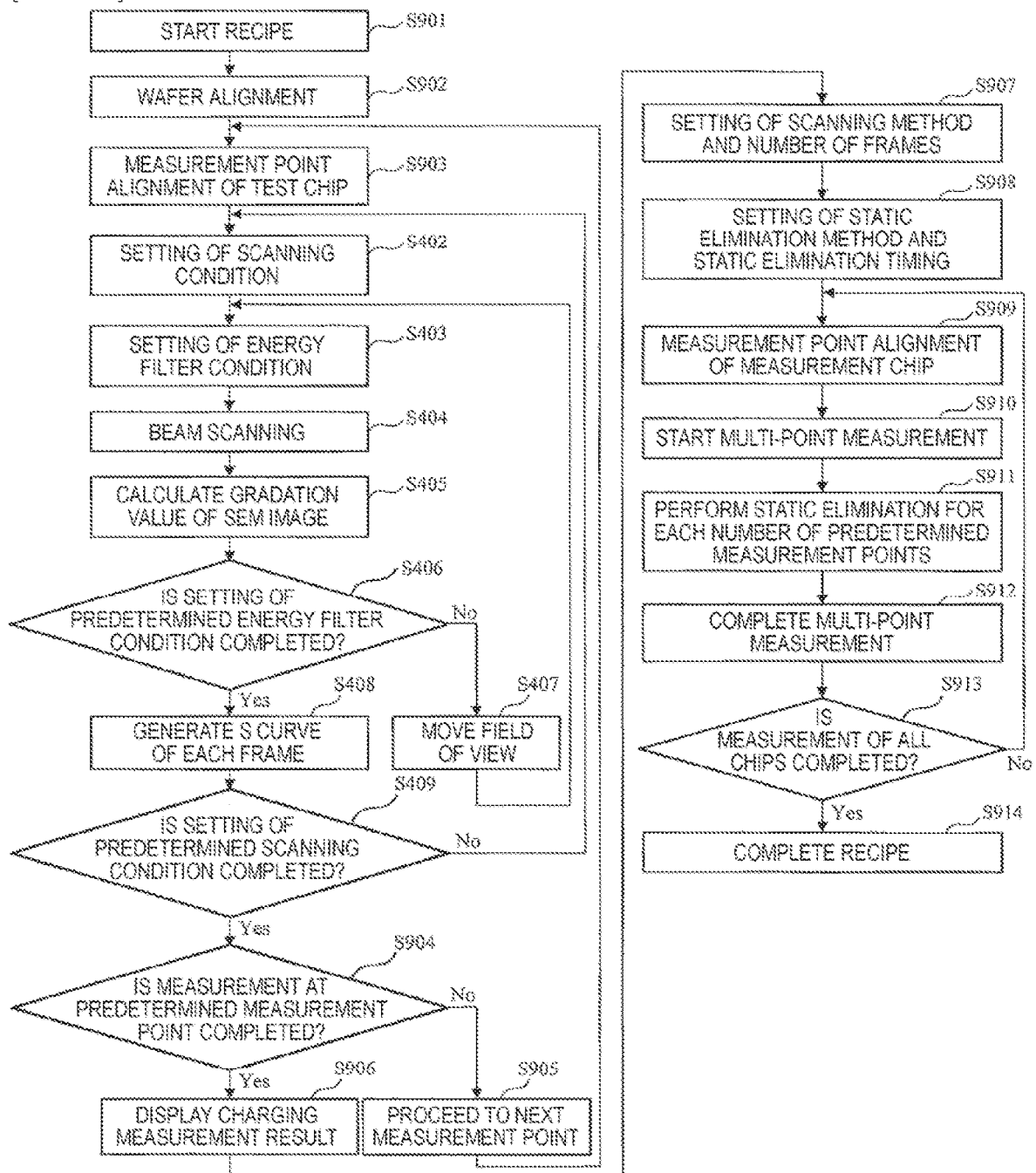
[FIG. 9]

[FIG. 10]
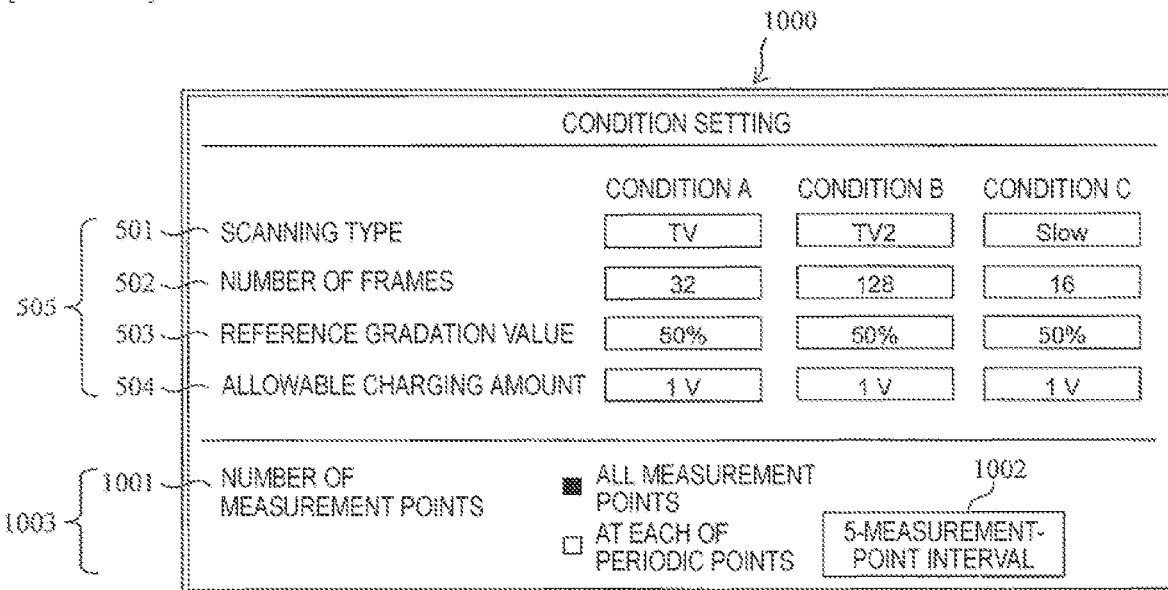
[FIG. 11]
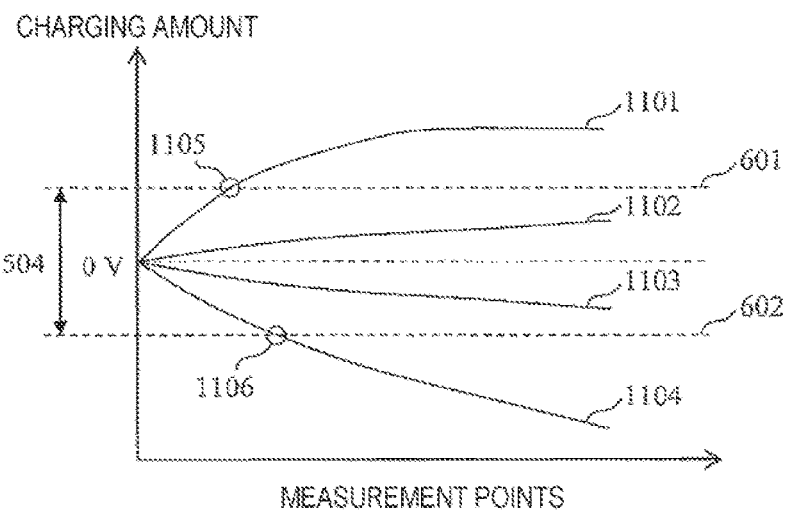

[FIG. 12]

| | | OPTIMUM CONDITION | |
|---|---|---|---|
| | ☐ CONDITION A | ■ CONDITION B | ☐ CONDITION C |
| 701 — SCANNING TYPE | TV | TV2 | Slow |
| 702 — NUMBER OF FRAMES | 32 | 128 | 16 |
| 703 — CHARGING CODE | positive | positive | negative |
| 704 — STATIC ELIMINATION METHOD | LCN ▼ | LCN ▼ | LIGHT IRRADIATION ▼ —706 |
| 1201 — STATIC ELIMINATION TIMING | FOR EVERY 10 MEASUREMENT POINTS | FOR EVERY 40 MEASUREMENT POINTS | FOR EVERY 5 MEASUREMENT POINTS |

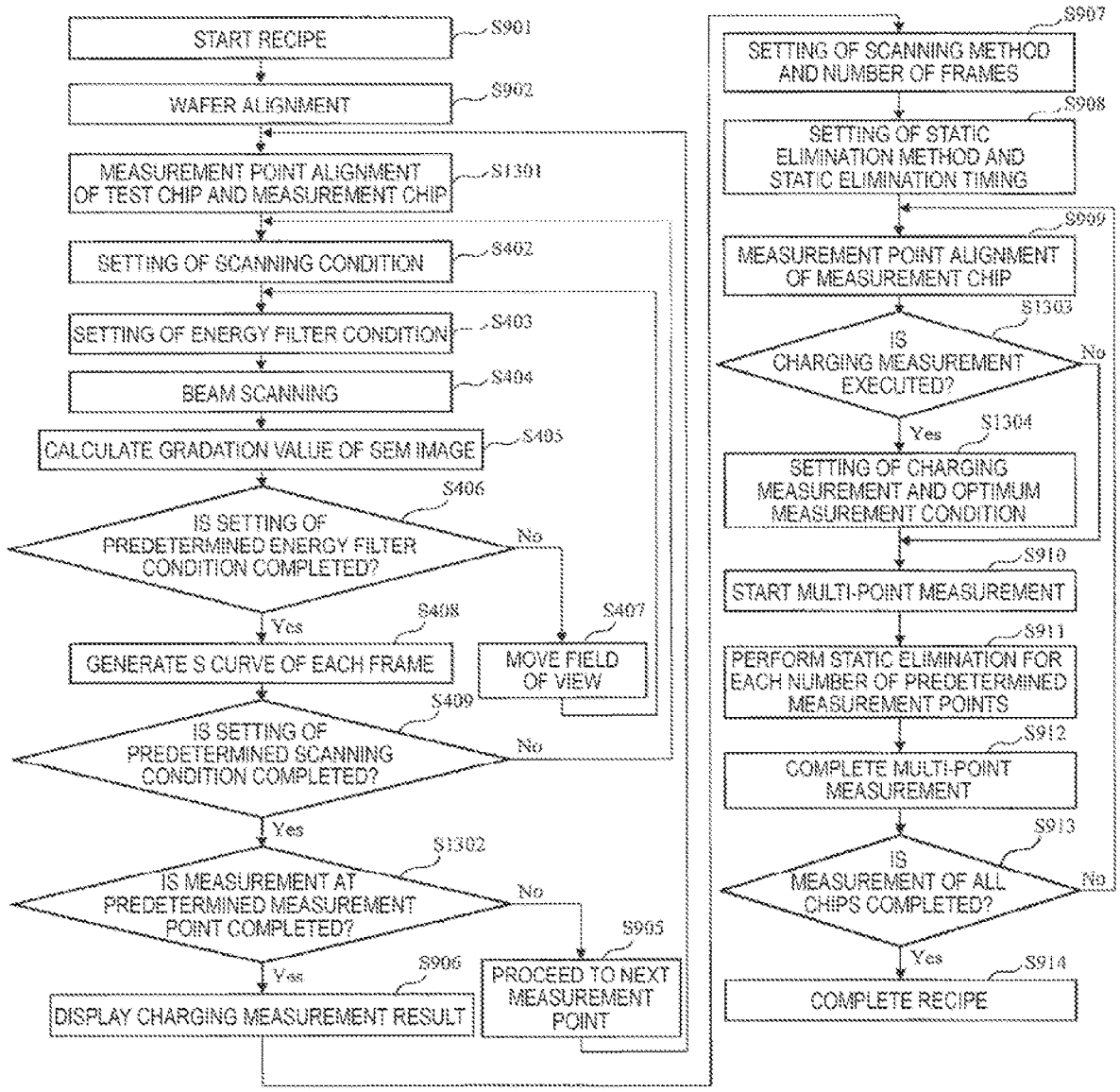

[FIG. 14]
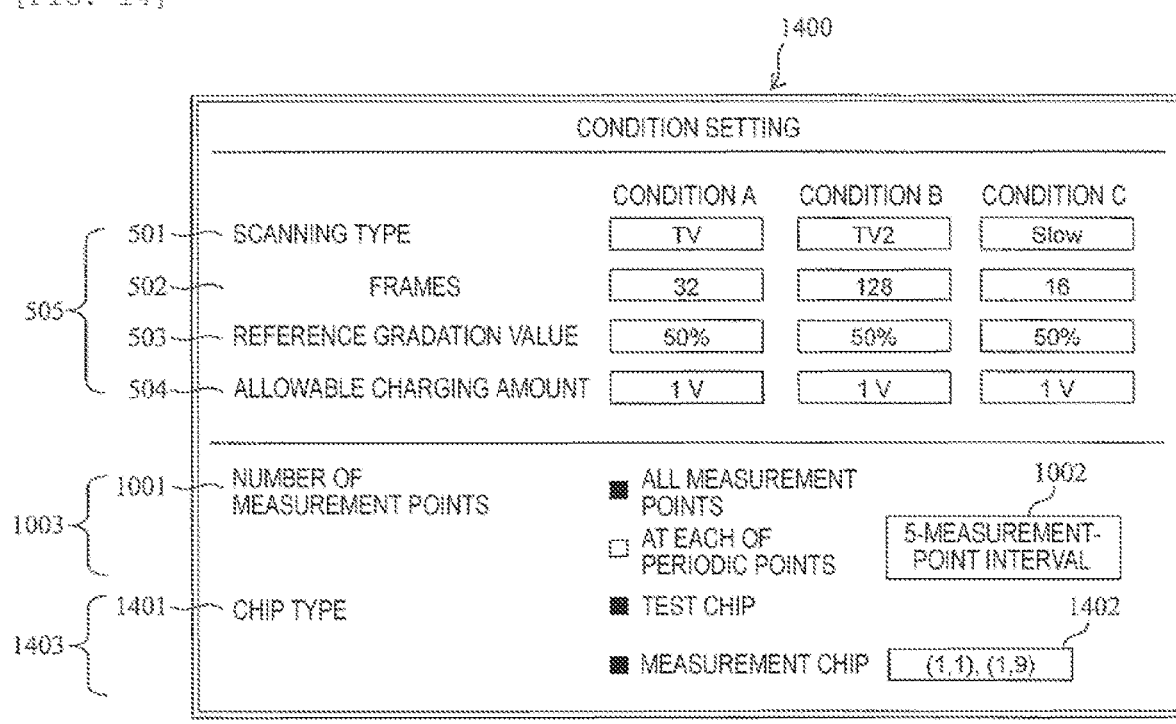

[FIG. 15]
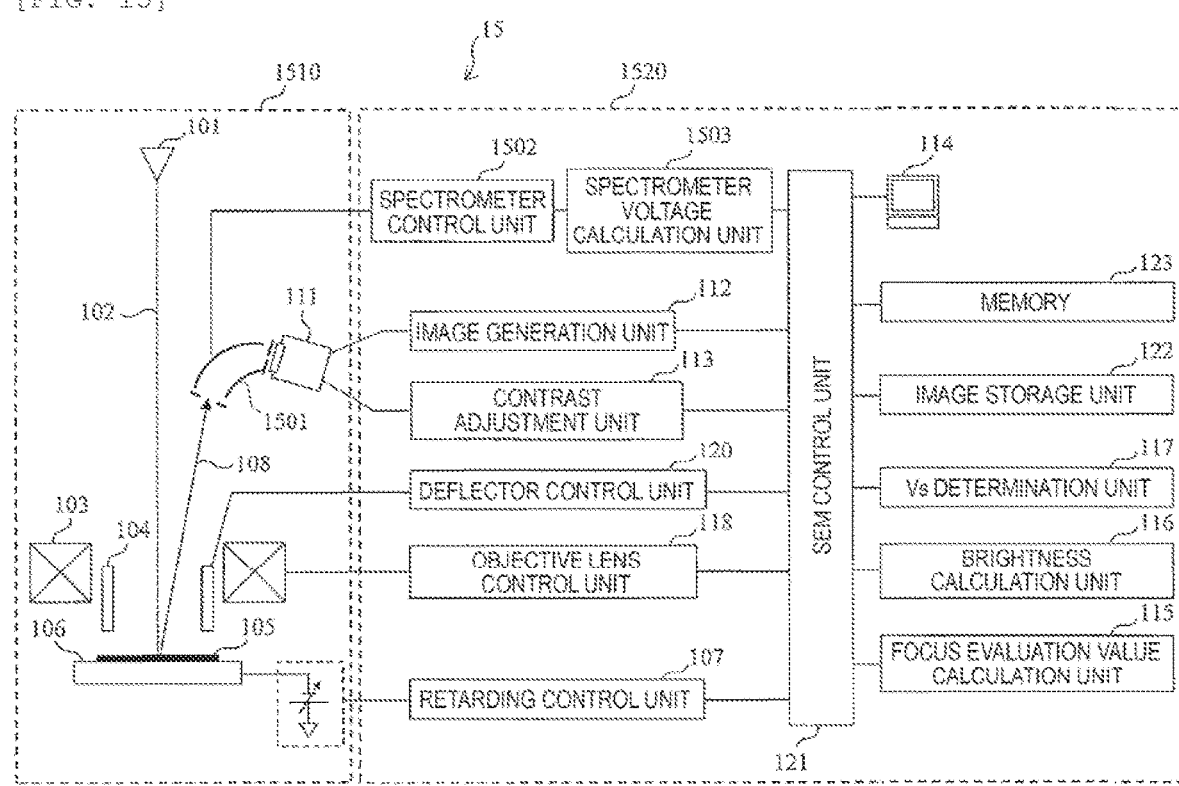

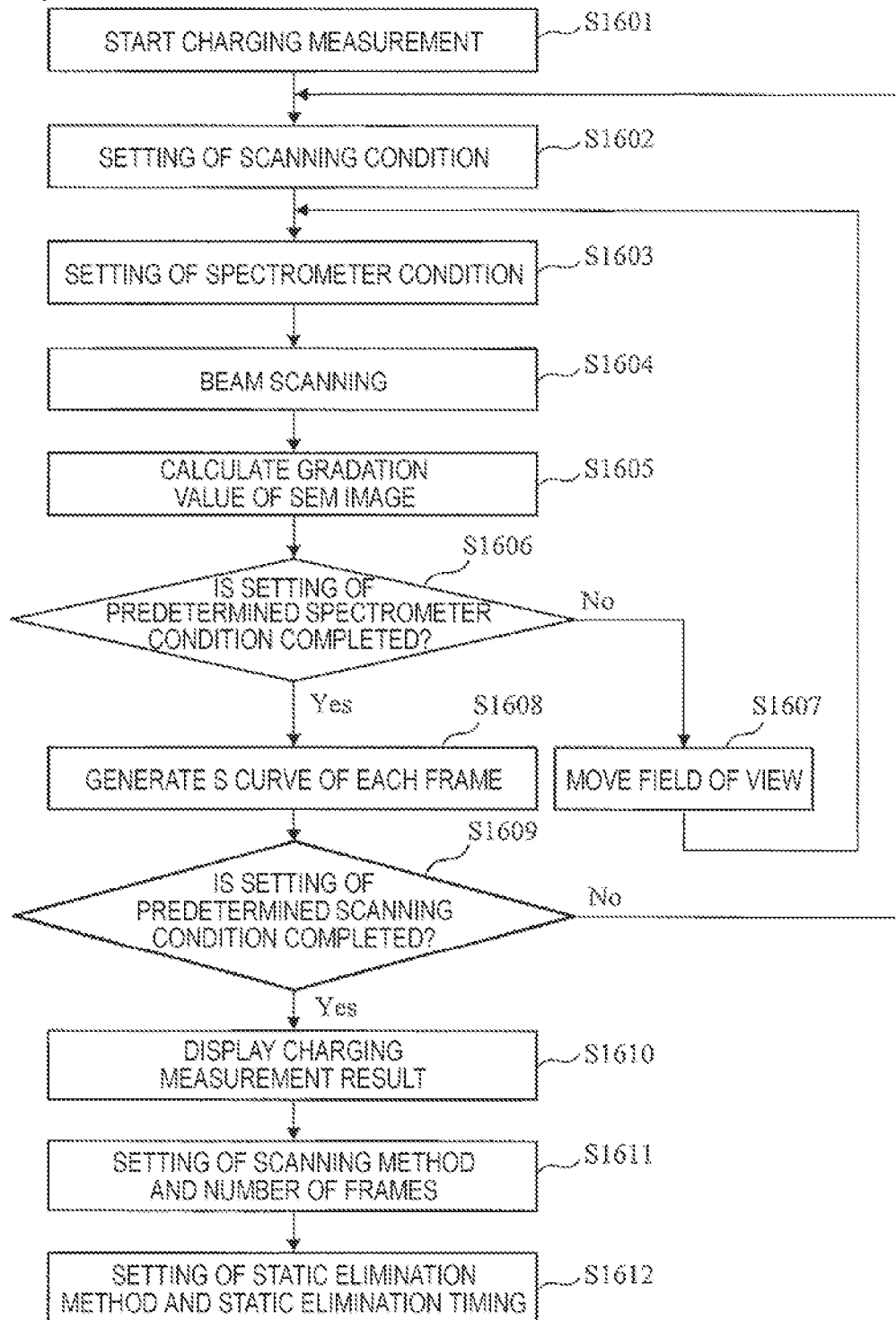

[FIG. 17]
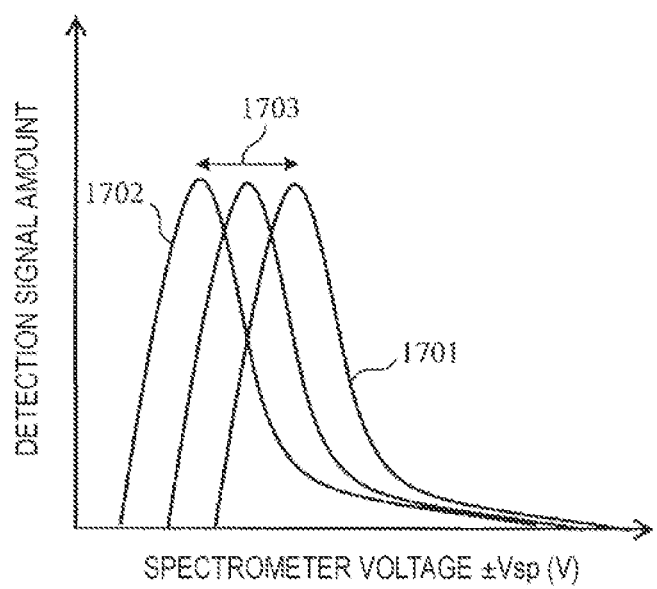

CHARGED PARTICLE BEAM SYSTEM AND METHOD FOR DETERMINING OBSERVATION CONDITIONS IN CHARGED PARTICLE BEAM DEVICE

TECHNICAL FIELD

The present disclosure relates to a charged particle beam system and a method for determining observation conditions in a charged particle beam device.

BACKGROUND ART

In semiconductor manufacturing processes, especially process control of an exposure process, dimensional measurement of resist patterns is important for improving yields. When EUV exposure, in which a fine pattern can be obtained by one time of exposure, is realized, a minimum exposure dimension of the resist pattern is expected to be significantly reduced from about 32 nanometers obtained by immersion ArF exposure to about 14 nanometers. Currently, a scanning electron microscope (hereinafter, referred to as an SEM) is widely used for measuring the dimensions of the resist patterns.

On the other hand, the resist material shrinks (hereinafter, referred to as shrinks) by the irradiation with the primary electrons. Therefore, in resist measurement for EUV exposure, it is required to reduce this shrinkage. Since the shrinkage is generated when energy of the primary electrons is applied to the resist, it is effective to reduce the irradiation energy of the primary electron in order to reduce the shrinkage.

However, since the resist is an insulating material, the pattern is charged by the irradiation with the primary electrons. Accordingly, the primary electrons are deflected, and thus, magnification fluctuates, which causes a problem that a resist pattern size cannot be measured accurately.

In order to solve the above-described problems, it is necessary to control charging. As control of charging, the scanning method for primary electrons (for example, scanning time and scanning order) is changed to suppress the charging itself, and the static elimination operation with an appropriate static elimination method (for example, mirror static elimination, light irradiation static elimination and the like) for the charging amount applied to the pattern, is generally used to perform to eliminate the charging. Specifically, as disclosed in JP-A-2017-134882 (PTL 1) and JP-A-2015-043334 (PTL 2), for example, a scanning method in which an energy filter is used to obtain the amount of charging, perform a static elimination operation, and suppress the charging having a short time to the minimum is determined.

CITATION LIST

Patent Literature

PTL 1: JP-A-2017-134882
PTL 2: JP-A-2015-043334
PTL 3: JP-A-2012-155980
PTL 4: JP-A-2009-004114

SUMMARY OF INVENTION

Technical Problem

A charged state of a resist pattern changes depending on the pattern arrangement even under the same material and the same irradiation conditions. Further, since the charging amount in which the magnification fluctuation occurs differs depending on the scanning method and pattern, the timing at which static elimination is required (for example, the number of frames and the number of measurement points) also differs depending on the scanning method and pattern. Therefore, the optimum scanning method, static elimination method, and static elimination timing are determined by the operator's trial and error, but these items cannot be determined as appropriate unless the charging amount is accurately measured.

In this regard, PTLs 1 and 2 disclose that the charging amount is obtained by using an energy filter, but there is no mention that the charging amount over time when irradiating primary electrons over a plurality of frames is accurately calculated. For this reason, even if the techniques disclosed in PTLs 1 and 2 are used, the optimum scanning method, static elimination method, and static elimination timing cannot be obtained.

The present disclosure has been made in view of such a situation, and provides a technique enabling accurate ascertaining of a charged state of a resist pattern resulting from irradiation of a charged particle beam.

Solution to Problem

In order to solve the above problems, the present disclosure discloses a charged particle beam system including: charged particle device including a charged particle source, a deflector that scans a primary charged particle beam emitted from the charged particle source on a sample, an energy discriminator that energy-discriminates a secondary electron emitted when the primary charged particle beam reaches the sample and a detector that detects the secondary electron that has passed through the energy discriminator; and a computer system that generates a scan image based on a detection signal amount of the detector that fluctuates according to scanning of the primary charged particle beam by the deflector and stores the scan image in an image storage unit, in which the computer system generates the scan image for each frame at the time of frame integration of the scan image, calculates a charging amount for each frame based on an output of the scan image for each frame, and outputs information on the charging amount.

Further features relating to the present disclosure will become apparent from the description herein and the accompanying drawings. Moreover, the aspect of the present disclosure is achieved and realized by the mode of elements and a combination of various elements, the detailed description below, and the appended claims.

It should be understood that the description herein is merely an exemplary example and does not limit the claims or applications of the present disclosure in any way.

Advantageous Effects of Invention

According to the present disclosure, it is possible to accurately ascertain a charged state of a resist pattern resulting from irradiation of a charged particle beam.

BRIEF DESCRIPTION OF DRAWINGS

FIG. 1 is a diagram showing a configuration example of an SEM type length measurement system (also referred to as a charged particle beam system, a charged particle beam inspection system, or the like) according to a first embodiment.

FIG. 2 is a diagram showing voltage dependence (S curve) obtained when an energy filter 109 is used.

FIG. 3 is a diagram showing charging measurement for each number of frames performed in one time of scanning.

FIG. 4 is a flowchart showing an optimum observation condition determination sequence.

FIG. 5 is a diagram showing an example of a screen (setting screen 500) for setting a condition (initial condition) for performing the charging measurement set in Step 402, which is displayed on a display unit 114.

FIG. 6 is a diagram showing an example of a screen displayed on the display unit 114 in Step 410 to display a charging measurement result for each number of frames corresponding to a plurality of scanning types.

FIG. 7 is a diagram showing an example of a screen displaying an optimum scanning type 701 and number of frames 702, a charging code 703, a static elimination method 704, and a static elimination timing 705, which are displayed on the display unit 114 in Steps 411 and 412 and can measure a pattern without magnification fluctuation due to charging.

FIG. 8 is a diagram showing a configuration of an SEM type length measurement system (also referred to as a charged particle beam system, a charged particle beam inspection system, or the like) 8 according to a second embodiment.

FIG. 9 is a flowchart showing a process of executing a multi-point measurement based on a recipe.

FIG. 10 is a diagram showing a configuration example of a screen displayed on a display unit 114 for setting conditions for performing the charging measurement set in Step 402.

FIG. 11 is a diagram showing a configuration example of a screen displayed on the display unit 114 in Step 906 to displaying a charging measurement result for each of measurement points corresponding to a plurality of scanning types.

FIG. 12 is a diagram showing a configuration example of a screen displaying the optimum scanning type 701 and number of frames 702, the charging code 703, the static elimination method 704, and a static elimination timing 1201 displayed on the display unit 114 in Steps 907 and S908 of FIG. 9.

FIG. 13 is a flowchart showing a process of performing charging measurement (multi-point measurement) in a measurement chip used for actual measurement in addition to charging measurement in a test chip according to a recipe.

FIG. 14 is a diagram showing a configuration example of a screen for setting conditions for performing the charging measurement set in Step 402 (FIG. 13), which is displayed on the display unit 114.

FIG. 15 is a diagram showing a configuration example of an SEM type length measurement system 15 according to a fourth embodiment.

FIG. 16 is a flowchart showing a charging amount measurement process by using a spectrometer 1501.

FIG. 17 is a diagram showing a method for calculating a charging amount from a spectrum (S curve).

DESCRIPTION OF EMBODIMENTS

Hereinafter, embodiments (first to fourth embodiments) of the present disclosure will be described with reference to the accompanying drawings. The attached drawings show specific embodiments based on a principle of the present technical idea, but these are for the purpose of understanding the present technical idea, and the present technical idea is not used for limitative interpretation.

In the embodiments, the description is made in sufficient detail for those skilled in the art to implement the present disclosure, but changes in configurations and structures and various replacements of elements are also possible without deviation from the scope and spirit of the technical idea of the present disclosure. Therefore, the following description should not be construed as to be limited to the present disclosure.

Further, as will be described later, the embodiments of the present disclosure may be implemented by software running on a general-purpose computer, or may be implemented by dedicated hardware or a combination of software and hardware.

As a sample observation device disclosed in the present embodiment, there is a charged particle beam device that scans a surface of a sample with charged particle beams (for example, electrons) and uses electrons that are secondarily generated. Examples of the charged particle beam device include an inspection device using a scanning electron microscope (SEM), a review device, and a pattern measurement device. Hereinafter, as an example, an example in which a charging measurement technique according to the present disclosure is applied to an SEM type length measurement device will be described.

As described above, in the related art, it has not been possible to accurately ascertain a charged state of a resist pattern. Therefore, it was not possible to determine an optimum scanning method, static elimination method, and static elimination timing. Furthermore, there was not known a method for automatically determining optimum conditions thereof. A time required for an operator to search for the optimum conditions is longer than an actual pattern dimensional inspection time, which causes a decrease in semiconductor production efficiency.

Therefore, in the present embodiment, there is provided a technique for automatically determining at least one of an optimum scanning method, a static elimination method, or a static elimination timing, in order to accurately ascertain a charged state of a resist pattern due to irradiation with charged particle beams and to measure a pattern without magnification fluctuation due to charging.

(1) First Embodiment

A first embodiment discloses calculation of the charging amount for each frame generated by scanning a predetermined location of the sample for a plurality of frames with an electron beam, not the charging amount generated by the basic principle (configuration) of the present technical idea, specifically by scanning the sample once with an electron beam. Further, the first embodiment also discloses that the optimum static elimination method and the static elimination timing are obtained and output based on the obtained charging amount for each frame.

<System Configuration Example>

FIG. 1 is a diagram showing a configuration example of an SEM type length measurement system (also referred to as a charged particle beam system, a charged particle beam inspection system, or the like) according to a first embodiment. A charged particle beam system (SEM type length measurement system) 1 includes an SEM type length measurement device (charged particle beam device) 100 including an electron beam optical system (charged particle beam optical system) for irradiating a sample 105 with an electron beam (also referred to as a primary electron beam) 102, a detection system for detecting an electron (secondary electron) 108 emitted from the sample 105 due to irradiation with the electron beam 102, and a stage mechanism system arranged in a vacuum chamber (not shown) and a computer system 200 including a control system that controls each component of a SEM type length measurement device 100 and processes various information.

The electron beam optical system includes, for example, an electron source (charged particle source) 101 that generates the electron beam 102, an objective lens 103 that adjusts a focal position of the electron beam 102, and a deflector 104 that scans the sample 105 with the electron beam 102. The detection system includes, for example, an energy filter (also referred to as a detection charged particle sorter (discrimination device) 109 and a detector 111. In addition, the electron beam optical system may include other lenses and electrodes, and the detection system may include other detectors. In addition, the configurations of the electron beam optical system and the detection system may be partially different from the above-mentioned components and may not be limited to the above-mentioned configurations.

In the SEM type length measurement device 100, the primary electron beam 102 generated by the electron source 101 is focused on the sample 105 by the objective lens 103. When generating the image, the primary electron beam 102 is deflected by the deflector 104 (the deflector 104 is operated by a deflector control unit 120 in response to a command of an SEM control unit 121), and the sample 105 is scanned with the primary electron beam 102.

The stage mechanism system includes a movable stage 106. The sample 105 is mounted on the movable stage 106 and electrically floats by a negative voltage given by a retarding control unit 107. For this reason, the primary electron beam 102 is subject to a deceleration action on the sample 105. On the other hand, a secondary electron 108 generated from the sample 105 is accelerated by a retarding voltage given by the retarding control unit 107 to reach the energy filter 109.

The energy filter 109 is used as an example of an energy discriminator, and is configured with, for example, at least one or more mesh-shaped electrodes. A negative voltage is applied from a filter control unit 110 to at least one mesh-shaped electrode in the energy filter 109, and it is possible to filter (select) the electrons detected by the detector 111 by the negative voltage. Then, the filtered electrons reach the detector 111. These electrons become detection signals through a detection amplifier or the like in the detector 111. In FIG. 1, since the detection amplifier is built in the detector 111, the detection amplifier is omitted.

The control of the SEM type length measurement device 100 is executed via the SEM control unit 121 and each of the control units (the retarding control unit 107, the filter control unit 110, an objective lens control unit 118, and the deflector control unit 120). That is, the SEM control unit 121 gives predetermined commands to the retarding control unit 107, the objective lens control unit 118, the filter control unit 110, and the deflector control unit 120, and the respective control units respond to the command and control the control objects (the objective lens 103, the deflector 104, the movable stage 106, and the energy filter 109). Specifically, the objective lens 103 is controlled by the objective lens control unit 118, and the energy filter 109 is controlled by the filter control unit 110. Further, the retarding voltage applied to the movable stage 106 is controlled by the retarding control unit 107. It is noted that, in FIG. 1, only the control units related to the technical idea of the present disclosure are shown, and the other control units are omitted.

The SEM control unit 121 further includes an image generation unit 112, a contrast adjustment unit 113, a display unit 114, a focus evaluation value calculation unit 115, a brightness calculation unit 116, a Vs (filter characteristic voltage) determination unit 117, and a Vf (filter voltage) calculation unit 119. The brightness calculation unit 116 has a function of calculating a gradation value of an SEM image. In addition, in the following, the components of the control system may be collectively referred to as a control processing unit.

The detection signal from the detector 111 is transmitted to the image generation unit 112. The image generation unit 112 generates an image by two-dimensionally mapping an intensity of the detection signal based on two-dimensional scanning on the sample 105 by the deflector 104. The image generated by the image generation unit 112 is stored in an image storage unit 122 through the SEM control unit 121. Further, the image generation unit 112 has a function of generating an image of each frame at the time of frame integration and storing the image in the image storage unit 122.

The components of the control system described above can be realized by using a general-purpose computer and may be realized as a function of a program executed on the computer. For this reason, FIG. 1 shows an example in which the components of the control system are realized by the computer system 200. The computer system 200 includes at least a processor such as a CPU (Central Processing Unit), a storage unit such as a memory 123, and a storage device such as a hard disk (including an image storage unit 122). For example, the computer system 200 is configured as a multiprocessor system, that is, the SEM control unit 121 may be configured as main processor, and the retarding control unit 107, the filter control unit 110, the objective lens control unit 118, and the deflector control unit 120 may be configured as respective sub-processors.

The control system processing described below may be stored as a program code in the memory 123 or a storage device (not shown), and the processor may read the respective program codes, load the program codes into an internal memory (not shown) of the processor to realize the respective control units, and execute the respective processes. A portion of the control system may be configured by hardware such as a dedicated circuit board.

<Charging Measurement and Static Elimination>

FIG. 2 is a diagram showing voltage dependence (S curve) obtained when the energy filter 109 is used. In FIG. 2, a vertical axis represents the gradation value (standardized) of the SEM image, and a horizontal axis represents an energy filter voltage applied by the filter control unit 110. In FIG. 2, an absolute value of the negative voltage given to the energy filter 109 increases toward the right side of the horizontal axis.

The charging amount of the pattern can be obtained from the energy filter voltage dependence (S curve) 201 of the SEM image gradation value obtained by scanning for charging measurement. As the energy filter voltage (Vf) increases, the number of secondary electron 108 filtered by the energy filter 109 increases. For this reason, the number of secondary electron 108 reaching the detector 111 is reduced, and the SEM image gradation value is lowered. A reference voltage 202 in the S curve 201 is the energy filter voltage in the reference gradation value 203. The reference gradation value 203 is, for example, set to ½ of a maximum value 204 (gradation value standardized for each frame, for example, standardized by setting the maximum value of the SEM image gradation value for each frame to 1 and setting the minimum value thereof to 0) of the SEM image gradation value. The charging amount of the pattern can be obtained from a deviation amount from the reference voltage (reference S curve) when the pattern is not charged. A method for determining the reference voltage 202 is not limited to the above method, and a shift of the S curve 201 may be obtained. For example, the reference voltage 202 may be set to ⅓ or ⅔ of the maximum value 204, or a location where the absolute value of the inclination of the S curve 201 is maximized may be set to the reference voltage 202.

The case where the S curve to be measured is shifted in the direction in which the absolute value of Vf is smaller than the reference S curve indicates that the energy of the secondary electron 108 generated in the pattern in the energy filter 109 is reduced, that is, that positive charging is performed. On the other hand, the case where the S curve to be measured is shifted in the direction in which the absolute value of Vf is larger than the reference S curve indicates that the energy of the secondary electron 108 generated in the pattern in the energy filter 109 is increased, that is, is negative charging. The scanning used to generate the reference S curve may be, for example, scanning of one frame.

FIG. 3 is a diagram showing charging measurement for each number of frames performed in one time of scanning. The image acquired in one time of scanning may be an image of one frame, or may be an image of a plurality of frames (when a plurality of frame images are acquired, a specific portion is continuously scanned for the number of frames. The image of an n-th frame is stored in the image storage unit 122. In the scanning of the n frames, the S curves are generated for the respective frames from 1 frame to n frames. Then, the charging amount in each frame can be measured from a deviation amount 303 from a reference S curve 301. An operator can arbitrarily (freely) set the number of frames for measuring the charging (the number of frames for scanning). For example, when measuring the charging amount for 8 frames for scanning of 16 frames, the charging amount for the 8 frames is obtained from the deviation amount between the S curve using the SEM image of an 8-th frame and the reference S curve. As an advantage of measuring the charging for each number of frames, for example, it is possible to determine how many frames are not affected by the charging, and it is possible to determine the maximum number of frames in which the magnification fluctuation does not occur. Further, since the relationship between the number of frames and the charging amount is not limited to linear increase and differs depending on the size, shape, direction, arrangement, density, or the like of the pattern, so that it is effective to measure the charging amount for each number of frames.

By executing the charging measurement for each number of frames by a plurality of scanning methods, the charging amount for each scanning method can be measured. An example of the scanning method, there is an example in which the scanning time, the scanning order, the scanning direction, and the scanning area are changed, and there is an example in which an acceleration voltage (energy) and a dose amount of the primary electron beam are changed. Even if the number of frames is the same, the scanning method is changed, and thus, the charging amount and the positive and negative signs change, so that by performing charging measurement for each scanning method, the scanning method that minimizes the charging amount and the scanning method in which the charging with an arbitrary code occurs can be explored.

Next, the static elimination method will be described. For the positive charging, for example, there is an LCN (Local Charge Neutralization) method that eliminates static electricity only in the positive charging area by setting the retarding voltage applied to the electron gun and the wafer to the same voltage (refer to JP-A-2012-155980 (PTL 3)). In the LCN method, since the energy of the electrons irradiated on the sample 105 is several eV, the irradiation damage is negligibly small. On the other hand, as a static elimination method for the negative charging, for example, there are a light irradiation method in which photoelectrons are emitted by ultraviolet light irradiation (refer to JP-A-2009-004114 (PTL 4)) and a predose method in which an electron beam is irradiated with a collision energy in which a secondary electron emission yield exceeds 1. However, these static elimination methods are only examples, and the static elimination methods applicable to the present embodiment are not limited thereto. Further, for example, the optimum static elimination method may be set in advance according to the scanning conditions (scanning method), and this relationship may be stored in the memory 123. At this time, the SEM control unit 121 may acquire (select) information on the optimum static elimination method corresponding to the scanning condition (scanning method) from the memory 123 and display the information on the display unit 114.

<Optimal Observation Condition Determination Sequence, or the Like>

A process of automatically determining at least one of a scanning method, a static elimination method, and a static elimination timing capable of measuring a pattern without magnification fluctuation due to charging will be described with reference to FIGS. 4, 5, 6, and 7.

(A) Optimal Observation Condition Determination Sequence

FIG. 4 is a flowchart showing an optimum observation condition determination sequence. In the first embodiment, for example, a sequence in which only a specific location of the pattern is scanned and measured will be described.

In the following, the processing of each step will be described with "each control unit" as the subject (operating main body), but the description may be made with the processor (or computer system) as the subject (operating main body), or the description may be with the "various programs" executed by the processor as the subject (operating main body). A portion or all of the programs may be implemented by dedicated hardware or may be modularized. Various programs may be installed in a computer system by a program distribution server or storage media.

(i) Step 401

The SEM control unit 121 reads a preset initial condition (for example, set by the operator) from, for example, the memory 123 and starts the charging measurement. The setting of the initial conditions will be described later.

(ii) Step 402

The SEM control unit 121 passes the scanning conditions to the deflector control unit 120. Then, the deflector control unit 120 sets the received scanning conditions.

(iii) Step 403

The SEM control unit 121 passes information on the energy filter voltage value to the filter control unit 110. Then, the filter control unit 110 sets the received energy filter voltage value.

(iv) Step 404

The deflector control unit 120 controls the deflector 104 based on the scanning conditions and scans the sample 105 with the beam.

(v) Step 405

The image generation unit 112 generates an SEM image based on the secondary electron detected by the detector 111 and passes the SEM image to the SEM control unit 121. The SEM control unit 121 stores the received SEM image in the image storage unit 122. Then, the brightness calculation unit 116 reads out the SEM image from the image storage unit 122 and calculates the gradation value of each frame. The SEM control unit 121 may directly supply the SEM image to the brightness calculation unit 116 without storing the SEM image in the image storage unit 122.

(vi) Step 406

The SEM control unit 121 determines whether the measurement based on all the energy filter conditions corresponding to the scanning conditions set at the present time has been completed (whether all the SEM image gradation values corresponding to the set energy filter voltage values can be obtained under the scanning conditions). When it is determined that the measurement based on all the energy filter conditions is completed (Yes in Step 406), the process proceeds to Step 408. When it is determined that the measurements based on all the energy filter conditions are not completed (No in Step 406), the process proceeds to Step 407.

That is, the SEM control unit 121 repeatedly executes the processes from Step 403 to Step 405 until the energy filter voltage is changed to a predetermined voltage in order to acquire the S curve.

(vii) Step 407

The SEM control unit 121 instructs the deflector control unit 120 to move the field of view to another pattern in the pattern of the same arrangement in order to suppress the influence of the charging caused by the scanning of the charging measurement itself. According to the instruction, the deflector control unit 120 sets the scanning position at a location (same coordinates in the pattern) corresponding to the scanning location in the scanned pattern, which is another pattern in the same array. Then, at the newly set scanning position, the processes from Steps 403 to 405 are executed.

(viii) Step 408

The brightness calculation unit 116 generates an S curve (refer to FIG. 3) in each frame. For example, the brightness calculation unit 116 acquires the SEM image gradation values for a plurality of frames corresponding to the respective energy filter set voltage values. Then, the brightness calculation unit 116 generates the S curve corresponding to each frame by plotting how the SEM image gradation value (normalized value) changes in each frame in response to each energy filter set voltage value on the S curve plane (horizontal axis is the energy filter set voltage value and vertical axis is the standardized SEM image gradation value).

(ix) Step 409

The SEM control unit 121 determines whether all the processes of the set scanning conditions are completed. When all the processes of the set scanning conditions are completed (Yes in Step 409), the process proceeds to Step 410. When all the processes of the set scanning conditions are not completed (No in Step 409), the process proceeds to Step 402, and the SEM control unit 121 instructs the deflector control unit 120 to change the scanning conditions. Then, the processes of Steps 403 to 408 are repeatedly executed.

(x) Step 410

The Vs determination unit 117 acquires the S curve corresponding to the set predetermined scanning conditions and, after that, displays the charging measurement result on the display unit 114. The method for displaying the charging measurement result will be described later.

(xi) Step 411

The SEM control unit 121 sets the optimum scanning method and number of frames according to the obtained charging amount and charging code.

(xii) Step 412

The SEM control unit 121 sets the optimum static elimination method and the static elimination timing according to the obtained charging amount and charging code.

(B) Initial Condition Setting

FIG. 5 is a diagram showing an example of a screen (setting screen 500) for setting conditions (initial conditions) for performing the charging measurement set in Step 402, which is displayed on the display unit 114.

The setting screen 500 includes a setting unit 505 for performing the charging measurement including a scanning type 501, a number of frames 502, a reference gradation value 503, an allowable charging amount 504, and the like.

The scanning type 501 is, for example, information indicating a scanning speed. As a scanning speed, for example, a low speed, a medium speed (normal speed), or a high speed is set. The number of frames 502 is information indicating the number of frames scanned by one time of scanning. The reference gradation value 503 is information indicating a value set as a reference gradation value as a ratio with respect to the maximum gradation value. The allowable charging amount 504 is information indicating the charging amount that serves as a threshold value for performing the static elimination. The allowable charging amount is held as a parameter in the SEM control unit 121 based on the charging amount and the deflection amount of the primary electron beam 102 calculated from the energy of the primary electron beam 102. Further, the allowable charging amount may be freely set by the operator. The relationship between the magnification fluctuation and the charging amount can be obtained in advance by measuring the pattern size and the charging amount.

In the example of FIG. 5, as the condition setting 500, a condition A which is a first charging measurement condition, a condition B which is a second charging measurement condition, and a condition C which is a third charging measurement condition are set. The condition A indicates that the charging measurement is performed by scanning for 32 frames at a TV (medium speed) under the condition of a reference gradation value of 50% and an allowable charging amount of 1 V. The condition B indicates that the charging measurement is performed by scanning for 128 frames at a TV2 (high speed) under the condition of a reference gradation value of 50% and an allowable charging amount of 1 V. The condition C indicates that the charging measurement is performed by scanning for 16 frames at a Slow (low speed) under the condition of a reference gradation value of 50% and an allowable charging amount of 1 V. Only one type of condition may be set, or a plurality of types of conditions may be set. A portion of the setting unit 505 of FIG. 5 may be deleted, or other conditions (for example, optical conditions, imaging magnification, coordinates, pixel sizes, or the like) may be added depending on the embodiment.

(C) Charging Measurement Result Display

FIG. 6 is a diagram showing an example of a screen displayed on the display unit 114 in Step 410 to display the charging measurement result for each number of frames corresponding to a plurality of scanning types. In FIG. 6, the vertical axis represents the charging amount, and the horizontal axis represents the number of frames. FIG. 6 is a graph obtained by plotting the respective charging amounts of frames 1 to n on the frame number-charging amount plane for each scanning condition.

In the example of FIG. 6, the allowable charging amount 504 is shown, but it is shown that static elimination does not need to be performed as long as the charging amount is within the range of the upper limit 601 and the lower limit 602 of the allowable charging amount 504. Further, in the example of FIG. 6, it is shown that the positive charging is used for the first scanning type 603 and the second scanning type 604, and the negative charging is used for the third scanning type 605 and the fourth scanning type 606. Further, it is shown that the scanning having the smallest charging amount in the positive charging is the second scanning type 604, and the scanning having the smallest charging amount in the negative charging is used for the third scanning type 605.

Therefore, the scanning type having the smallest charging amount can be determined from the charging measurement results for the respective frames in a plurality of scanning types. It is also possible to determine the scanning type having the smallest charging amount for each of the positive charging and the negative charge. Further, in the first scanning type 603, the fluctuation in magnification does not occur until the number of frames 607 reaches the upper limit 601 of the allowable charging amount. In the fourth scanning type 606, the fluctuation in magnification does not occur until the number of frames 608 reaches the lower limit 602 of the allowable charging amount.

As described above, in each scanning type, the number of frames which is less than or equal to the allowable charging amount 504 and the number of frames for performing static elimination can be determined. Further, it can be seen that there is a case where the extremely large number of frames may not reach the allowable charging amount depending the scanning type, the material of the pattern, the dimensions, the shape, the direction, the arrangement, the density, or the like.

(D) Determining Optimum Scanning Type, or the Like

FIG. 7 is a diagram showing an example of a screen displaying an optimum scanning type 701 and number of frames 702, a charging code 703, a static elimination method 704, and a static elimination timing 705, which are displayed on the display unit 114 in Steps 411 and 412 and can measure the pattern without the magnification fluctuation due to the charging.

In the example of FIG. 7, it can be seen that the condition B for scanning 128 frames in the TV2 scanning is the scanning method in which the charging amount is minimized, and the scanning method is displayed as the optimum condition that the static elimination is not required. Further, it is shown that in the scanning method for the condition A, the positive charging exceeding the allowable charging amount occurs at the time of integrating 16 frames, and thus, the static elimination for every 16 frames is required to be performed. Then, the method for eliminating the positive charging can be selected from a tab 706.

Further, it can be seen that, under the condition C, the negative charging exceeding the allowable charging amount occurs at the time of integrating 4 frames, and thus, the static elimination for every 4 frames is required to be performed. The optimum condition to be displayed may be only one condition or may have a plurality of conditions. When there are a plurality of optimum conditions, the optimum conditions may be set so that they can be selected by the operator, or the optimum conditions may be set so as to be automatically determined. In the case of automatic determination, for example, the scanning condition with the minimum charging amount (as can be seen from FIG. 6) may be selected.

Summary of First Embodiment

According to the first embodiment, the charging amount of each frame is calculated by setting a plurality of types of scanning conditions (for example, scanning a specific location with a plurality of frames by TV, TV2, Slow, or the like) for the sample, calculating the SEM image gradation value while changing the energy filter voltage according to each scanning condition, and generating an S curve (change in the gradation value with respect to each energy filter voltage value) of each frame. By doing so, it is possible to accurately ascertain the charging amount for each frame generated by the electron beam scanning for a plurality of frames. That is, it is possible to accurately ascertain the charged state of the pattern accompanying the electron beam irradiation. In addition, the calculated charging amount is compared with the set allowable charging amount, and it is confirmed at what frame scanning the allowable charging amount is exceeded. Accordingly, it is possible to derive the optimum static elimination timing. Further, since the polarity of charging of each frame can be known from the S curve, it is possible to know the optimum static elimination method.

(2) Second Embodiment

In the second embodiment, a case where multi-point measurement is performed by using a sequence for automatically determining at least one of the optimum scanning conditions, the static elimination method, and the static elimination timing will be described. Even if it is not described in the present embodiment, the matters described in the first embodiment can be applied to the present embodiment unless there are special circumstances.

When performing multi-point measurement in a wafer or chip, the charging amount increases as the number of measurement points increases, so that it is necessary to perform a static elimination operation at regular measurement point intervals. However, since the charging measurement is not performed at the time of multi-point measurement and the charging amount and the positive negative charging code are unknown, there is a problem that the static elimination operation is excessively performed and the measurement time is long. If the charging amount and the charging code for each number of measurement points can be measured or predicted, the optimum static elimination method and the static elimination timing can be known, so that the multi-point measurement time can be reduced.

The second embodiment provides measures to solve such a problem.

<System Configuration>

FIG. 8 is a diagram showing a configuration of an SEM type length measurement system (also referred to as a charged particle beam system, a charged particle beam inspection system, or the like) 8 according to a second embodiment. In FIG. 8, in addition to the deflector 104 in FIG. 1, a sub-deflector 801 and a sub-deflector control unit 802 for controlling the sub-deflector 801 are mounted. The movement of the field of view or the measurement point may be realized by moving the sample 105 by using the movable stage 106 or may be realized by deflecting the primary electron beam 102 by using the sub-deflector 801.

<Multi-Point Measurement Sequence, or the Like>

A sequence for automatically determining at least one of an optimum scanning method, a static elimination method, and a static elimination timing capable of measuring a pattern without magnification fluctuation due to charging will be described with reference to FIGS. 9, 10, 11, and 12. In the present embodiment, the charging measurement and the determination of the optimum measurement conditions are automatically performed by the recipe process.

(A) Multi-Point Measurement Sequence

FIG. 9 is a flowchart showing a process of executing multi-point measurement based on the recipe. In FIG. 9, since the processes from Steps 402 to 409 are the same as those of the first embodiment (FIG. 4), the description is maintained to a minimum, and the processing contents are as described above.

(i) Step 901

The SEM control unit 121 reads a recipe for multi-point measurement processing from, for example, the memory 123. The recipe contains, for example, information about multiple measurement points on a test chip.

(ii) Step 902

When the sample 105 is loaded on the movable stage 106, the SEM control unit 121 controls a stage control unit (not shown) according to the read recipe so that the movable stage 106 performs wafer alignment for rotation and calibration of initial coordinates of the sample 105.

(iii) Step 903

In response to a command from the SEM control unit 121, the sub-deflector control unit 802 operates the sub-deflector 801 to execute the measurement point alignment for aligning the relative positions of the measurement points of the test chip registered by the operator (user) (for example, it is specified by the operator whether all the measurement points included in the recipe are to be scanned or every predetermined number of measurement points is to be scanned) and the primary electron beam 102. Although the movable stage 106 may be moved to perform the measurement point alignment, the measurement point alignment can be completed in a shorter time by using the sub-deflector 801.

(iv) Steps 402 to 409

Under the preset initial conditions described later, the charging measurement is performed for each frame by a plurality of scanning methods for the test chip in the same manner as the operations from Step S402 to Step S409 in FIG. 4. That is, the deflector control unit 120 sets the scanning conditions (Step 402). Next, the filter control unit 110 sets the energy filter voltage value (Step 403). Then, the deflector control unit 120 controls the deflector and scans the measurement point with the beam (Step 404).

Further, the brightness calculation unit 116 calculates the gradation value of each frame from the obtained SEM image (Step 405). Subsequently, the SEM control unit 121 repeatedly executes the processes from Step 403 to Step 405 in order to acquire the S curve until the energy filter voltage is changed to be a predetermined voltage (Step 406). In addition, when the execution is repeated, the field of view is moved within the pattern of the same arrangement in order to suppress the influence of the charging caused by the scanning of the charging measurement itself (Step 407).

Next, the brightness calculation unit 116 generates an S curve in each frame (Step 408). Then, the SEM control unit 121 changes the scanning conditions and repeatedly executes the processes from Step 403 to Step 408 (Step 409).

(v) Step 904

The SEM control unit 121 determines whether the processes from Step 402 to Step 409 are completed for all the set measurement points. When the processes are completed for all the measurement points (Yes in Step 904), the process proceeds to Step 906. When the processes are not completed for all the measurement points (No in Step 904), the process proceeds to Step 905.

(vi) Step 905

The SEM control unit 121 issues a command to the sub-deflector control unit 802, the deflector control unit 120, and the like so that the unprocessed measurement points (for example, the next measurement point when the processing order is specified in the recipe) among the set measurement points are set as processing targets. That is, the processes of Steps S903 and Steps S402 to S409 are repeatedly executed for all the measurement points set in the recipe.

(vii) Step 906

The Vs determination unit 117 acquires the S curve at each measurement point and each scanning condition and, after that, displays the charging measurement result on the display unit 114. The method for displaying the charging measurement result will be described later.

(viii) Step 907

The SEM control unit 121 sets the optimum scanning method and number of frames according to the obtained charging amount and charging code. In the present embodiment, the optimum scanning method denotes, for example, a scanning method in which the charging amount is minimized, a scanning method in which a desired charging code is obtained, a scanning method in which a desired static elimination method is effective, or the like. Further, the optimum number of frames may be, for example, the number of frames 502 for which the charging measurement is performed or may be the number of frames serving as an arbitrary charging amount.

(ix) Step 908

The SEM control unit 121 sets the optimum static elimination method and the static elimination timing according to the obtained charging measurement result. In the present embodiment, the static elimination timing denotes, for example, a measurement point interval for executing the static elimination, a chip point interval for executing the static elimination, or the like.

(x) Step 909

In response to a command from the SEM control unit 121, the sub-deflector control unit 802 operates the sub-deflector 801 to perform a multi-point measurement and executes the measurement point alignment for aligning the relative position between the measurement point of the measurement chip registered by the operator (user) and the primary electron beam 102.

(xi) Step 910

In response to a command from the SEM control unit 121, the deflector control unit 120 starts the multi-point measurement by using the set scanning method and the number of frames. That is, the multi-point measurement is executed for the same location as the location measured by a test pattern.

(xii) Step 911

The SEM control unit 121 executes the static elimination for each measurement point at the static elimination method and the static elimination timing set in Step 908.

(xiii) Step 912

The SEM control unit 121 ends the multi-point measurement.

(xiv) Step 913

The SEM control unit 121 determines whether the measurement of all the measurement chips set in the recipe is completed. When the measurement of all the measurement chips set in the recipe is completed (Yes in Step 913), the process proceeds to Step 914. When the measurement of all the measurement chips set in the recipe is not completed (No in Step 913), the process proceeds to Step 909. That is, the processes from Step 909 to Step 912 are repeatedly executed until the measurement of all the chips is completed.

(xv) Step 914

The SEM control unit 121 ends the recipe process.

(B) Configuration Example of Charging Measurement Condition Setting Screen

FIG. 10 is a diagram showing a configuration example of a screen displayed on the display unit 114 for setting conditions for performing the charging measurement set in Step 402.

A charging measurement condition setting screen 1000 has the setting unit 505 for performing the charging measurement of the scanning type 501, the number of frames 502, the reference gradation value 503, the allowable charging amount 504, or the like and a measurement point setting unit 1003 for setting measurement points 1001 for performing the charging measurement, a measurement point interval 1002 or the like when performing charging measurement for each periodic point.

The setting unit 505 has the function described in the first embodiment. That is, the allowable charging amount 504 indicates a charging amount that serves as a threshold value for performing static elimination. The allowable charging amount is held as a parameter in the SEM control unit 121 based on the charging amount and the deflection amount of the primary electron beam 102 calculated from the energy of the primary electron beam 102. Further, the operator can set arbitrarily (freely) the allowable charging amount. The relationship between the magnification fluctuation and the charging amount can be obtained in advance by measuring the pattern size and the charging amount.

In the example of FIG. 10, a condition A which is the first charging measurement condition, a condition B which is the second charging measurement condition, and a condition C which is the third charging measurement condition are set. The condition A indicates that the charging measurement is performed by scanning for 32 frames at a TV under the condition of a reference gradation value of 50% and an allowable charging amount of 1 V. The condition B indicates that the charging measurement is performed by scanning for 128 frames at the TV2 under the condition of a reference gradation value of 50% and an allowable charging amount of 1 V. The condition C indicates that the charging measurement is performed by scanning for 16 frames at the Slow under the condition of a reference gradation value of 50% and an allowable charging amount of 1 V. The condition may be one type of condition or may be a plurality of types of conditions. A portion of the setting unit 505 of FIG. 10 may be deleted, or other conditions (for example, optical conditions, imaging magnification, coordinates, pixel sizes, or the like) may be added depending on the embodiment.

In the measurement point setting unit 1003, the operator can set the number of measurement points 1001 for performing the charging measurement. In the example of FIG. 10, performing the charging measurement at all measurement points is selected. In order to shorten the time required for the charging measurement, the charging measurement may be performed at each periodic point at an arbitrary measurement point interval 1002.

(C) Configuration Example of Charging Measurement Result Display Screen

FIG. 11 is a diagram showing a configuration example of a screen displayed on the display unit 114 in Step 906, displaying the charging measurement result for each of measurement points corresponding to a plurality of scanning types. In FIG. 11, the vertical axis represents the charging amount, and the horizontal axis represents the number of measurement points. The charging amount at each measurement point on the horizontal axis may be set to the charging amount at the number of frames 502 in which the charging measurement is performed or may be set to the charging amount at any other arbitrary number of frames.

When the allowable charging amount 504 is within the range of the upper limit 601 and the lower limit 602, the static elimination may not be performed. In the example of FIG. 11, it is shown that the positive charging is used for the first scanning type 1101 and the second scanning type 1102, and the negative charging is used for the third scanning type 1103 and the fourth scanning type 1104. Further, it is shown that the scanning having the smallest charging amount in the positive charging is the second scanning type 1102, and the scanning having the smallest charging amount in the negative charging is used for the third scanning type 1103. Therefore, the scanning type having the smallest charging amount can be determined from the charging measurement results for the respective measurement points in the plurality of scanning types.

It is also possible to determine the scanning type having the smallest charging amount for each of the positive charging and the negative charge. It can also be seen that, in the first scanning type 1101, the magnification fluctuation does not occur until the number of measurement points 1105 reaches the upper limit 601 of the allowable charging amount. It can also be seen that, in the fourth scanning type 1104, the magnification fluctuation does not occur until the number of measurement points 1106 reaches the lower limit 602 of the allowable charging amount. Therefore, for each scanning type, it is possible to determine at which the number of measurement points is less than or equal to the allowable charging amount 504 or the number of measurement points for performing the static elimination.

As described above, it can be seen that there is a case where even the extremely large number of measurement points may not reach the allowable charging amount depending on the scanning type, the material of the pattern, the dimensions, the shape, the direction, the arrangement, the density, or the like. The charging amount for each number of frames can be displayed on the display unit 114 in S906, for example, by using the total number of frames of all the measurement points as the horizontal axis, as in the example shown in FIG. 6.

(D) Determining Optimum Scanning Type, or the Like

FIG. 12 is a diagram showing an example of a screen configuration displayed on the display unit 114 in Steps 907 and S908 of FIG. 9 for displaying an optimum scanning type 701 and number of frames 702 capable of measuring a pattern without magnification fluctuation due to charging, a charging code 703, a static elimination method 704, and a static elimination timing 1201.

In the example of FIG. 12, the condition B for the scanning for 128 frames by TV2 (high-speed) scanning is the scanning method that minimizes charging amount, and the scanning method is displayed as the optimum condition with the longest interval between the measurement points that require static elimination. In the scanning method for the condition B, it is shown that the positive charging exceeding the allowable charging amount occurs at the time of measuring 40 points, and thus, the static elimination for every 40 measurement points is required to be performed.

Further, the tab 706 is configured so that a method for eliminating positive charging can be selected. Then, it is shown that in the scanning method for the condition A, the positive charging exceeding the allowable charging amount occurs at the time of measuring 10 points, and thus, the static elimination for every 10 measurement points is required to be performed. Further, it is shown that, in the scanning method for the condition C, the negative charging exceeding the allowable charging amount occurs at the time of measuring 5 points, and thus, the static elimination for every 5 measurement points is required to be performed.

The optimum conditions displayed may be only one condition or may be a plurality of conditions. When there are a plurality of optimum conditions, that the optimum conditions may be set so as to be selected by the operator, or the optimum conditions may be set so as to be automatically determined.

Summary of Second Embodiment

According to the second embodiment, the charging amount at the plurality of points (multi-points) on the test chip is calculated according to the plurality of types of scanning conditions by generating the S curve of each frame as in the first embodiment and the change in the charging amount with respect to the measurement point (refer to FIG. 11) is obtained, and the static elimination timing, the optimum scanning conditions (the best conditions among the plurality of types of the scanning conditions), and the optimum static elimination method are output (are present to the operator). By doing so, it is possible to reduce the execution of unnecessary static elimination operations and optimize the measurement time.

(3) Third Embodiment

In the third embodiment, in addition to the charging measurement on the test chip in the second embodiment, a case where the charging measurement (multi-point measurement) is performed on the measurement chip used for the actual measurement will be described. Although not described in the present embodiment, the matters described in the first and second embodiments can be applied to the present embodiment unless there are special circumstances.

In the second embodiment, it has been described that the charging measurement is performed for each frame by a plurality of scanning methods using the test chip and the multi-point measurement is started after obtaining the optimum static elimination method and the static elimination timing. However, for example, in the case where the charging amount generated is distributed in the wafer surface, there is a possibility that a discrepancy may occur between the charging amount of the test chip and the charging amount of the measurement chip. Therefore, there is a possibility that it is difficult to accurately determine (or predict) the static elimination timing for only the test chip. In this case, there is a concern that, when the static elimination is insufficient, the magnification fluctuates due to charging, and when the static elimination is excessive, the measurement time becomes long.

Therefore, in the present embodiment, as an example, a case where it is predicted that the charging tendency is different only in the outer peripheral portion of the wafer will be described. The same system configuration as in FIG. 8 can be applied. As a measurement chip for performing the charging measurement, at least one chip on the outer peripheral portion of the wafer is designated and used. The optimum scanning method, the static elimination method, and the static elimination timing determined by the charging measurement are applied to at least one chip on the outer periphery of the wafer. The designated area is not limited to the outer peripheral portion of the wafer, and any area can be designated. For example, a chip included in the intermediate area or the inner peripheral (center) area of the wafer may be designated as a measurement point in addition to or instead of the outer peripheral portion of the wafer.

<Multi-Point Measurement Sequence or the Like>

FIG. 13 is a flowchart showing a process of performing charging measurement (multi-point measurement) on the measurement chip used for the actual measurement in addition to the charging measurement on the test chip according to the recipe. The charging measurement is performed on the measurement chip at the timing immediately after the measurement point alignment process (Step 909) of the measurement chip in FIG. 9, and the other sequences are almost the same as those in FIG. 9. Therefore, the description of FIG. 13 may be simplified, but the details are as described above.

(i) Step 901 and Step 902

For example, the SEM control unit 121 reads the recipe from the memory 123 (Step 901), and controls the stage control unit (not shown) so as to rotate the sample 105 loaded on the movable stage 106 and perform wafer alignment to calibrate the initial coordinates of the movable stage 106 (Step 902).

(ii) Step 1301

The sub-deflector control unit 802 executes measurement point alignment for aligning the relative positions of the primary electron beams 102 of the measurement point of the test chip registered by the operator and the measurement chips used for actual measurement.

(iii) Steps 402 to 409

Under the preset initial conditions described later, the charging measurement is performed for each frame by a plurality of scanning methods with the test chip in the same manner as the operations from Step S402 to Step S409 in FIG. 4. That is, the deflector control unit 120 sets the scanning conditions (Step 402). The charging measurement on the measurement chip used for the actual measurement is executed in Steps 1303 and 1304 described later.

Next, the filter control unit 110 sets the energy filter voltage (Step 403). Then, the deflector control unit 120 controls the deflector and scans the measurement point with the beam (Step 404).

Further, the brightness calculation unit 116 calculates the gradation value of each frame from the obtained SEM image (Step 405). Subsequently, the SEM control unit 121 repeatedly executes the processes from Step 403 to Step 405 in order to acquire the S curve until the energy filter voltage is changed to be a predetermined voltage (Step 406). In addition, when the execution is repeated, the field of view is moved within the pattern of the same arrangement in order to suppress the influence of the charging caused by the scanning of the charging measurement itself (Step 407).

Next, the brightness calculation unit 116 generates an S curve in each frame (Step 408). Then, the SEM control unit 121 changes the scanning conditions and repeatedly executes the processes from Step 403 to Step 408 (Step 409).

(iv) Step 1302

The SEM control unit 121 determines whether the measurement at all the measurement points (all the measurement points specified by the operator) on the test chip is completed. When the measurement at all the measurement points is completed (Yes in Step 1302), the process proceeds to Step 906. When the measurement at all the measurement points is not completed (No in Step 1302), the process proceeds to Step 905.

(v) Step 905

The SEM control unit 121 issues a command to the sub-deflector control unit 802, the deflector control unit 120, and the like so that the unprocessed measurement points (for example, the next measurement point when the processing order is specified in the recipe) among the set measurement points are set as processing targets. That is, the processes of Steps S1301 and S402 to S409 are repeatedly executed for all the measurement points set in the recipe.

(vi) Step 906

The Vs determination unit 117 obtains an S curve at each measurement point and each scanning condition in response to a command from the SEM control unit 121 and, after that, displays the charging measurement result on the display unit 114. The method for displaying the charging measurement result will be described later.

(vii) Step 907

The SEM control unit 121 sets the optimum scanning method and number of frames according to the obtained charging amount and charging code. In the present embodiment, the optimum scanning method denotes, for example, a scanning method in which the charging amount is minimized, a scanning method in which a desired charging code is obtained, a scanning method in which a desired static elimination method is effective, or the like. Further, the optimum number of frames may be, for example, set as the number of frames 502 for which charging measurement has been performed or may be set as the number of frames having an arbitrary charging amount.

(viii) Step 908

The SEM control unit 121 sets the optimum static elimination method and the static elimination timing according to the obtained charging measurement result. In the present embodiment, the static elimination timing denotes, for example, a measurement point interval for executing the static elimination, a chip point interval for executing the static elimination, or the like.

(ix) Step 909

In response to a command from the SEM control unit 121, the sub-deflector control unit 802 operates the sub-deflector 801 to perform a multi-point measurement and executes the measurement point alignment for aligning the relative positions of the measurement point of the measurement chip registered by the operator (user) and the primary electron beam 102.

(x) Step 1303

In the above recipe, the SEM control unit 121 determines whether the actual measurement chip is set as the chip that executes the charging measurement in addition to the test chip. This setting will be described later.

When the actual measurement chip is set as the chip that executes the charging measurement (Yes in Step 1303), the process proceeds to Step 1304. When the actual measurement chip is not set as the chip that executes charging measurement (No in Step 1303), the process proceeds to Step 910.

(xi) Step 1304

The SEM control unit 121 controls the sub-deflector control unit 802, the deflector control unit 120, the filter control unit 110, the brightness calculation unit 116, the Vs determination unit 117, and the like with respect to the set actual measurement chip, and the charging measurement is executed in the order of Step 1301, Step 402 to Step 409, Step 1302, and Step 906 to Step 908 to set the optimum measurement conditions.

The setting value of the optimum measurement condition obtained in Step 1304 may be different from the set value (static elimination method and static elimination timing) obtained in Step 908. In that case, for example, the set value obtained by using the actual measurement chip is used for the case of measuring the location corresponding to the measurement point of the measurement chip, and the set value obtained from the test chip can be used for the case of measuring the other location.

(xii) Step 910

In response to a command from the SEM control unit 121, the deflector control unit 120 starts the multi-point measurement by using the scanning method and the number of frames set in Step 907 or Step 1304. That is, the multi-point measurement is executed for the same location as the test chip or the location where the charging measurement is performed by the test chip and the actual measurement chip.

(xiii) Step 911

The SEM control unit 121 executes the static elimination at predetermined measurement points at the static elimination method and static elimination timing set in Step 908 or Step 908 and Step 1304.

(xiv) Step 912

The SEM control unit 121 ends the multi-point measurement.

(xv) Step 913

The SEM control unit 121 determines whether the measurement of all the measurement chips set in the recipe is completed. When the measurement of all the measurement chips set in the recipe is completed (Yes in Step 913), the process proceeds to Step 914. When the measurement of all the measurement chips set in the recipe is not (No in Step 913), the process proceeds to Step 909. That is, the processes of Step 909, Step 1303, Step 1304, and Steps 910 to 912 are repeatedly executed until the measurement of all the measurement chips is completed.

(xv) Step 914

The SEM control unit 121 ends the recipe process.

<Configuration Example of Charging Measurement Condition Setting Screen>

FIG. 14 is a diagram showing a configuration example of a screen displayed on the display unit 114 for setting a condition for performing the charging measurement set in Step 402 (FIG. 13).

The charging measurement condition setting screen 1400 includes, as constituent items, for example, the setting unit 505 for performing the charging measurement such as the scanning type 501, the number of frames 502, the reference gradation value 503, and the allowable charging amount 504, a measurement points 1001 for performing the charging measurement, a setting unit 1003 for setting the measurement point interval 1002 and like when performing the charging measurement for each periodic point, and a setting unit 1403 for setting a chip type 1401 for which the charging measurement is performed, and the chip number 1402 for the case or the like where the charging measurement with the measurement chip is performed.

The setting unit 505 has the function described in the first embodiment. That is, the allowable charging amount 504 indicates a charging amount that serves as a threshold value for performing static elimination. The allowable charging amount is held as a parameter in the SEM control unit 121 based on the charging amount and the deflection amount of the primary electron beam 102 calculated from the energy of the primary electron beam 102. Further, the operator can arbitrarily (freely) set the allowable charging amount. The relationship between the magnification fluctuation and the charging amount can be obtained in advance by measuring the pattern size and the charging amount.

In the configuration example of FIG. 14, the condition A which is the first charging measurement condition, the condition B which is the second charging measurement condition, or the condition C which is the third charging measurement condition is set on the charging measurement condition setting screen 1400. The condition A indicates that the charging measurement is performed by scanning for 32 frames at a TV (medium speed (normal speed)) under the condition of the reference gradation value of 50% and the allowable charging amount of 1 V. The condition B indicates that charging measurement is performed by scanning for 128 frames at the TV2 (high speed) under the condition of a reference gradation value of 50% and an allowable charging amount of 1 V. The condition C indicates that the charging measurement is performed by scanning for 16 frames at the Slow (low speed) under the condition of a reference gradation value of 50% and an allowable charging amount of 1 V.

A portion of the setting unit 505 of FIG. 14 may be deleted, or other conditions (for example, optical conditions, imaging magnification, coordinates, pixel sizes, or the like) may be added depending on the embodiment.

The measurement point setting unit 1003 has the function described in the second embodiment. That is, the operator can set the number of measurement points 1001 for performing the charging measurement. In the example of FIG. 14, performing the charging measurement at all measurement points is selected. In order to shorten the time required for the charging measurement, the charging measurement may be performed at each periodic point at an arbitrary measurement point interval 1002.

The chip type setting unit 1403 is configured so that the chip type 1401 for performing the charging measurement can be set. In the example of FIG. 14, performing the charging measurement with the test chip and the charging measurement with the two chips of the actual measurement chips (1,1) and (1,9) is selected (refer to the item 1402).

The screen (charging measurement result display screen) displayed on the display unit 114 in Step 906 of FIG. 13 for displaying the charging measurement results for each measurement point in a plurality of scanning types can be configured in the same manner as the configuration example of the screen of FIG. 11. Further, the screen displaying the optimum scanning type 701 and number of frames 702, the charging code 703, the static elimination method 704, and the static elimination timing 1201 displayed on the display unit 114 in Steps 907 and 908 of FIG. 9 for measuring the pattern without the magnification fluctuation due to charging can be configured in the same manner as the configuration example of FIG. 12.

Summary of the Third Embodiment

According to the third embodiment, the charging amount at the plurality of points (multi-points) on the actual measurement chip as well as the test chip is calculated according to the plurality of types of scanning conditions by generating the S curve of the frame as in the first embodiment, and the change in the charging amount with respect to the measurement point (serving as the same characteristics as in FIG. 11) is obtained, and the static elimination timing, the optimum scanning conditions (the best conditions among the plurality of types of the scanning conditions), and the optimum static elimination method are output (are present to the operator). By doing so, even when the charging is not uniformly generated in the wafer surface (for example, the charging distribution is different in the outer peripheral area, the intermediate area, and the inner peripheral (center) area of the wafer), the static elimination operation can be executed without excess or deficiency, and, thus, the measurement time can be optimized.

(3) Fourth Embodiment

A fourth embodiment discloses a modified example of the first embodiment (another configuration example of the SEM type length measurement system).

FIG. 15 is a diagram showing a configuration example of the SEM type length measurement system 15 according to the fourth embodiment. Instead of the energy filter 109, the filter control unit 110, and the Vf (filter voltage) calculation unit 119 in the SEM type length measurement system 1 shown in FIG. 1, a spectrometer 1501, a spectrometer control unit 1502, and a spectrometer voltage calculation unit 1503 are mounted.

The spectrometer 1501 is an energy discriminator of a different type from the energy filter 109, and is configured with two cylindrical electrodes. A voltage is applied between the outer electrode and the inner electrode from the spectrometer 1501 and the spectrometer control unit 1502. The magnitude of the voltage applied to the inner/outer electrodes is calculated by the spectrometer voltage calculation unit 1503. Herein, when it is assumed that the outer electrode has a negative voltage of −Vsp and the inner electrode has a positive voltage of +Vsp, the secondary electron 108 having specific energy passes through the spectrometer 1501 and is detected by the detector 111. In this embodiment, a spectrometer using a cylindrical electrode will be described, but the effect of the present disclosure is not limited to the case of a cylindrical electrode. For example, the same effect can be obtained with a spherical type spectrometer or a spectrometer using a magnetic field. Further, the spectrometer 1501 may be floated by a voltage Voffset, a voltage of Voffset−Vsp may be applied to the outer electrode, and a voltage of Voffset+Vsp may be applied to the inner electrode.

FIG. 16 is a flowchart showing a charging amount measurement process by using the spectrometer 1501. The charging measurement by using the spectrometer 1501 is almost the same as the sequence shown in FIG. 4.

(i) Step 1601

The SEM control unit 121 reads a preset initial condition (for example, set by the operator) from, for example, the memory 123 and starts the charging measurement.

(ii) Step 1602

The SEM control unit 121 passes the scanning conditions to the deflector control unit 120. Then, the deflector control unit 120 sets the received scanning conditions.

(iii) Step 1603

The SEM control unit 121 passes the information on the spectrometer voltage value to the spectrometer control unit 1502. Then, the spectrometer control unit 1502 sets the received spectrometer voltage value.

(iv) Step 1604

The deflector control unit 120 controls the deflector 104 based on the scanning conditions and scans the sample 105 with the beam.

(v) Step 1605

The image generation unit 112 generates an SEM image based on the secondary electron detected by the detector 111 and passes the SEM image to the SEM control unit 121. The SEM control unit 121 stores the received SEM image in the image storage unit 122. Then, the brightness calculation unit 116 reads out the SEM image from the image storage unit 122 and calculates the gradation value of each frame. The SEM control unit 121 may directly supply the SEM image to the brightness calculation unit 116 without storing the SEM image in the image storage unit 122.

(vi) Step 1606

The SEM control unit 121 determines where the measurement based on all the spectrometer conditions corresponding to the scanning conditions set at the present time has been completed (whether all the SEM image gradation values corresponding to the set spectrometer voltage values can be obtained under the scanning conditions). When it is determined that the measurement based on all the spectrometer conditions is completed (Yes in Step 1606), the process proceeds to Step 1608. When it is determined that the measurements based on all the spectrometer conditions are not completed (No in Step 1606), the process proceeds to Step 1607.

That is, in order to acquire the S curve, the SEM control unit 121 repeatedly executes the processes from Step 1603 to Step 1605 until the spectrometer voltage is changed to a predetermined voltage.

(vii) Step 1607

The SEM control unit 121 instructs the deflector control unit 120 to move the field of view to another pattern in the pattern of the same arrangement in order to suppress the influence of the charging caused by the scanning of the charging measurement itself. According to the instruction, the deflector control unit 120 sets the scanning position at a location (same coordinates in the pattern) corresponding to the scanning location in the scanned pattern, which is another pattern in the same array. Then, at the newly set scanning position, the processes from Steps 1603 to 1605 are executed.

(viii) Step 1608

The brightness calculation unit 116 generates a spectrum (S curve) (refer to FIG. 17) in each frame. For example, the brightness calculation unit 116 acquires the detection signal amounts for a plurality of frames corresponding to the respective spectrometer set voltage values. Then, the brightness calculation unit 116 generates the S curve corresponding to each frame by plotting how the detection signal amount (normalized value) changes in each frame in response to each spectrometer set voltage value in the S-curve plane (horizontal axis is the spectrometer set voltage and vertical axis is the normalized detection signal amount).

(ix) Step 1609

The SEM control unit 121 determines whether all the processes of the set scanning conditions are completed. When all the processes of the set scanning conditions are completed (Yes in Step 1609), the process proceeds to Step 1610. When all the processes of the set scanning conditions are not completed (No in Step 1609), the process proceeds to Step 1602, and the SEM control unit 121 instructs the deflector control unit 120 to change the scanning conditions. Then, the processes of Steps 1603 to 1608 are repeatedly executed.

(x) Step 1610

The Vs determination unit 117 displays the charging measurement result on the display unit 114 after acquiring the S curve corresponding to the set predetermined scanning conditions. The method for displaying the charging measurement result will be described later.

(xi) Step 1611

The SEM control unit 121 sets the optimum scanning method and number of frames according to the obtained charging amount and charging code.

(xii) Step 1612

The SEM control unit 121 sets the optimum static elimination method and the static elimination timing according to the obtained charging amount and charging code. The display contents of Steps 1611 and 1612 are as shown in FIG. 7.

<Calculation of Charging Amount>

FIG. 17 is a diagram showing a method for calculating the charging amount from the spectrum (S curve). FIG. 17 shows the spectrum (example) generated in Step 1608. In FIG. 17, the horizontal axis represents the voltage value applied to the spectrometer 1501 by the spectrometer control unit 1502, and the vertical axis represents the detection signal amount of the detector 111.

When the sample 105 is positively charged, the energy of the secondary electron 108 in the spectrometer 1501 decreases, so that the spectrum shifts to the left. On the other hand, when the sample 105 is negatively charged, the energy of the secondary electron 108 in the spectrometer 1501 increases, so that the spectrum shifts to the right.

The charging amount 1703 can be calculated by the difference between the reference spectrum 1701 and the spectrum 1702 at the n-th frame. In the present embodiment, the difference between the spectrum 1701 and the spectrum 1702 is shown so as to be the difference in the spectrometer voltage that is maximized as the detection signal amount, but the difference between the reference spectrum 1701 and the spectrum 1702 of the nth frame may be calculated by another method. For example, the shift amount may be calculated by using the result of differentiating the spectrum.

The charging amount obtained in the present embodiment can also be applied to the charging amount measurement according to the second and third embodiments.

Summary of Fourth Embodiment

According to the fourth embodiment, instead of the energy filter (high-pass filter) used in the first embodiment, a spectrometer (band pass filter) that allows only secondary electron having a specific energy different from that of the energy filter to pass through is used. By doing so, it is possible to detect secondary electrons that cannot be detected by the energy filter depending on the type of sample, and even in such a case, it is possible to accurately ascertain the charged state of the pattern resulting from irradiation of the electron beam. In addition, the calculated charging amount is compared with the set allowable charging amount, and it is confirmed at what frame scanning the allowable charging amount is exceeded. Accordingly, it is possible to derive the optimum static elimination timing. Further, since the polarity of charging of each frame can be known from the S curve, it is possible to know the optimum static elimination method.

(5) Other Embodiments

The function of each embodiment can also be realized by a program code of the software. In this case, a storage medium in which the program code is recorded is provided to the system or device, and the computer (or CPU or MPU) of the system or device reads out the program code stored in the storage medium. In this case, the program code itself read out from the storage medium realizes the function of the above-described embodiment, and thus, the program code itself and the storage medium storing the program code itself constitute the present disclosure. As examples of the storage medium for supplying such a program code, used are a flexible disk, a CD-ROM, a DVD-ROM, a hard disk, an optical disk, a magneto-optical disk, a CD-R, a magnetic tape, a non-volatile memory card, a ROM, and the like.

Further, the OS (operating system) or the like running on the computer may perform a portion or all of the actual processes based on the instruction of the program code, and the functions of the above-described embodiment may be realized by the processes. Further, after the program code read from the storage medium is written in the memory on the computer, the CPU of the computer or the like performs a portion or all of the actual processes based on the instruction of the program code, so that the functions of the above-described embodiment may be realized by the processes.

Further, by distributing the program code of the software that realizes the functions of the embodiment via the network, the program is stored in a storage means such as a hard disk or a memory of a system or a device or a storage medium such as a CD-RW or a CD-R and the computer (or CPU or MPU) of the system or device may read and execute the program code stored in the storage means or the storage medium at the time of use.

Finally, it should be understood that the processes and techniques described here are not essentially associated with any particular device and can be implemented with any suitable combination of components. In addition, various types of devices for general purpose can be used according to the teachings described herein. It may be found out it is useful to build a dedicated device to carry out the steps of the method described here. In addition, various inventions can be formed by appropriately combining the plurality of components disclosed in the embodiments. For example, some components may be removed from all the components shown in the embodiments. In addition, components across different embodiments may be combined as appropriate. The present disclosure has been described in connection with specific examples, but these are for illustration purposes only, not for limitation in all respects. Those skilled in the art will find that there are numerous combinations of hardware, software, and firmware suitable for implementing the present disclosure. For example, the described software can be implemented in a wide range of programs or scripting languages such as assembler, C/C++, perl, Shell, PHP, and Java (registered trade mark).

Further, in the above-described embodiment, the control lines and information lines are shown as necessary for explanation, and the product does not necessarily show all the control lines and information lines. All configurations may be interconnected.

REFERENCE SIGNS LIST 1, 8, 15: SEM type length measurement system (charged particle beam system)
100, 810, 1510: SEM type length measurement device (charged particle beam device)
200, 820, 1520: computer system
101: electron source
102: primary electron beam
103: objective lens
104: deflector
105: sample (wafer)
106: movable stage
107: retarding control unit
108: secondary electron
109: energy filter
110: filter control unit
111: detector
112: image generation unit
113: contrast adjustment unit
114: display unit
115: focus evaluation value calculation unit
116: brightness calculation unit
117: filter characteristic voltage (Vs) determination unit
118: objective lens control unit
119: Vf (filter voltage) calculation unit
120: deflector control unit
121: SEM control unit
122: image storage unit
801: sub-deflector
802: sub-deflector control unit
1501: spectrometer
1502: spectrometer control unit
1503: spectrometer voltage calculation unit

The invention claimed is:

1. A charged particle beam system comprising:
a charged particle device including a charged particle source, a deflector that scans a primary charged particle beam emitted from the charged particle source on a sample, an energy discriminator that energy-discriminates a secondary electron emitted when the primary charged particle beam reaches the sample and a detector that detects the secondary electron that has passed through the energy discriminator; and
a computer system that generates a scan image based on a detection signal amount of the detector that fluctuates according to scanning of the primary charged particle beam by the deflector and stores the scan image in an image storage unit,
wherein the computer system generates a scan image for each frame of a plurality of frames obtained by the detector at the time of frame integration of the scan image, wherein the scan image for each frame is acquired by continuously scanning a specific portion of the sample with the primary charged particle beam, calculates a charging amount for each frame based on an output of the scan image for each frame, and outputs information on the charging amount.

2. The charged particle beam system according to claim 1, wherein the computer system obtains a timing of static elimination based on information on the calculated charging amount for each frame and outputs information on the timing.

3. The charged particle beam system according to claim 2, wherein the computer system determines the number of frames in which the charging amount for each frame exceeds a set allowable charging amount as a timing of performing the static elimination.

4. The charged particle beam system according to claim 1, wherein the computer system determines a method for static elimination based on information on the calculated charging amount for each frame.

5. The charged particle beam system according to claim 4, wherein the computer system determines the method for static elimination based on a polarity of the charging amount for each frame.

6. The charged particle beam system according to claim 3, wherein the computer system calculates the charging amount for each frame based on the detection signal amount obtained by scanning the primary charged particle beam on the sample according to a plurality of types of set scanning conditions and determines and outputs optimum static elimination conditions corresponding to the plurality of types of the scanning conditions.

7. The charged particle beam system according to claim 6,
wherein the scanning conditions include information on a scanning speed and the number of frames acquired by scanning, and
wherein the plurality of types of the scanning conditions are set so that the scanning speed and the number of frames are different among the scanning conditions.

8. The charged particle beam system according to claim 7,
wherein the computer system outputs a scanning condition indicating the charging amount within the set allowable charging amount among a plurality of the charging amounts corresponding to the plurality of types of the scanning conditions as an optimum scanning condition.

9. The charged particle beam system according to claim 2,
wherein the computer system calculates the charging amount for each frame based on a scanned image for each frame obtained by scanning the primary charged particle beam on a plurality of measurement points on a test chip or a plurality of measurement points on the test chip and a measurement chip according to a plurality of types of set scanning conditions.

10. The charged particle beam system according to claim 9,
wherein the computer system calculates and outputs a change in the charging amount with respect to the measurement point according to the plurality of types of scanning conditions.

11. The charged particle beam system according to claim 10,
wherein the computer system calculates the static elimination timing corresponding to the plurality of types of the scanning conditions by comparing the change in the charging amount to the measurement point with a set allowable charging amount.

12. The charged particle beam system according to claim 11,
wherein the computer system controls the charged particle device so as to scan the primary charged particle beam on the measurement chip according to selected scanning conditions and to execute a static elimination operation at the static elimination timing corresponding to the selected scanning conditions.

13. The charged particle beam system according to claim 1,
wherein the energy discriminator is an energy filter or a spectrometer.

14. The charged particle beam system according to claim 1,
wherein the computer system generates the scan image by using different detection signal amounts for each number of frames, calculates the charging amount for each number of frames based on an output of the scan image for each number of frames, and outputs the information on the charging amount for each number of frames.

15. A charged particle beam system comprising:
a charged particle device including a charged particle source, a deflector that scans a primary charged particle beam emitted from the charged particle source on a sample, an energy discriminator that energy-discriminates a secondary electron emitted when the primary charged particle beam reaches the sample and a detector that detects the secondary electron that has passed through the energy discriminator; and
a computer system that generates a scan image for each frame of a plurality of frames obtained by the detector based on a detection signal amount of the detector that fluctuates according to scanning of the primary charged particle beam by the deflector and stores the scan image in an image storage unit, wherein the scan image for each frame is acquired by continuously scanning a specific portion of the sample with the primary charged particle beam,
wherein the computer system calculates a charging amount in the sample based on the scan images obtained corresponding to a plurality of types of scanning conditions, selects a scanning condition in which the charging amount is less than or equal to a predetermined value or a scanning condition which issues a minimum charging amount, and selects a static elimination method corresponding to the selected scanning condition.

16. A method for determining an observation condition in a charged particle beam device, comprising:
detecting a secondary electron by a detector by energy-discriminating the secondary electron obtained by scanning a primary charged particle beam emitted from a charged particle source on a sample;
generating, by a computer, a scan image for each frame of a plurality of frames obtained by the detector based on a detection signal amount of the detector that fluctuates according to scanning of the primary charged particle beam, wherein the scan image for each frame is acquired by continuously scanning a specific portion of the sample with the primary charged particle beam;
calculating, by the computer, a charging amount for each frame based on an output of the scan image for each frame; and
outputting information on the charging amount by the computer.

* * * * *